(12) United States Patent
Tagami et al.

(10) Patent No.: US 11,817,428 B2
(45) Date of Patent: Nov. 14, 2023

(54) MEMORY DEVICE

(71) Applicant: KIOXIA CORPORATION, Tokyo (JP)

(72) Inventors: Masayoshi Tagami, Kuwana (JP); Ryota Katsumata, Yokkaichi (JP); Jun Iijima, Yokkaichi (JP); Tetsuya Shimizu, Yokkaichi (JP); Takamasa Usui, Yokkaichi (JP); Genki Fujita, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/590,373

(22) Filed: Feb. 1, 2022

(65) Prior Publication Data

US 2022/0157784 A1 May 19, 2022

Related U.S. Application Data

(63) Continuation of application No. 16/916,979, filed on Jun. 30, 2020, now Pat. No. 11,270,980, which is a
(Continued)

(30) Foreign Application Priority Data

Mar. 7, 2017 (JP) ................................ 2017-042675

(51) Int. Cl.
*H01L 29/788* (2006.01)
*H01L 25/065* (2023.01)
(Continued)

(52) U.S. Cl.
CPC .......... *H01L 25/0657* (2013.01); *H01L 24/08* (2013.01); *H01L 25/50* (2013.01);
(Continued)

(58) Field of Classification Search
CPC ........ H10B 41/10; H10B 41/27; H10B 43/10; H10B 43/27; H10B 43/35; H10B 43/40;
(Continued)

(56) References Cited

U.S. PATENT DOCUMENTS

| 5,759,753 A | 6/1998 | Namba et al. |
| 7,852,676 B2 | 12/2010 | Maejima |

(Continued)

FOREIGN PATENT DOCUMENTS

| JP | 6-1752 | 1/1994 |
| JP | 3924810 | 3/2007 |

(Continued)

*Primary Examiner* — Theresa T Doan
(74) *Attorney, Agent, or Firm* — Oblon, McClelland, Maier & Neustadt, L.L.P.

(57) ABSTRACT

A memory device includes a first memory cell array, a second memory cell array disposed in a first direction with respect to the first memory cell array, a first contact plug extending in the first direction through the first memory cell array, and a second contact plug extending in the first direction through the second memory cell array. The first memory cell array includes first electrode layers stacked in a first direction, and a first semiconductor pillar extending through the first electrode layers in the first direction. The second memory cell array including second electrode layers stacked in the first direction, and a second semiconductor pillar extending in the first direction through the second electrode layers. The first contact plug is electrically connected to the first semiconductor pillar, and the second contact plug is electrically connected to the second semiconductor pillar and the first contact plug.

8 Claims, 23 Drawing Sheets

Related U.S. Application Data continuation of application No. 16/390,639, filed on Apr. 22, 2019, now Pat. No. 10,741,527, which is a continuation of application No. 15/706,017, filed on Sep. 15, 2017, now Pat. No. 10,297,578.

(51) Int. Cl.

| | | |
|---|---|---|
| *H01L 25/00* | (2006.01) | |
| *H01L 23/00* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |
| *H10B 43/35* | (2023.01) | |
| *H10B 43/40* | (2023.01) | |
| *H10B 43/50* | (2023.01) | |

(52) U.S. Cl.
CPC ............ *H10B 41/10* (2023.02); *H10B 41/27* (2023.02); *H10B 43/10* (2023.02); *H10B 43/27* (2023.02); *H10B 43/35* (2023.02); *H10B 43/40* (2023.02); *H10B 43/50* (2023.02); *H01L 24/05* (2013.01); *H01L 2224/0401* (2013.01); *H01L 2224/05025* (2013.01); *H01L 2224/05147* (2013.01); *H01L 2224/05571* (2013.01); *H01L 2224/08146* (2013.01); *H01L 2225/06544* (2013.01); *H01L 2225/06565* (2013.01)

(58) Field of Classification Search
CPC ..... H10B 43/50; H10B 41/35; H01L 25/0657; H01L 24/08; H01L 25/50; H01L 2224/0401; H01L 2224/05025; H01L 2224/08146; H01L 2225/06544; H01L 2225/06565; H01L 25/18
USPC ......................................................... 257/315
See application file for complete search history.

(56) References Cited

U.S. PATENT DOCUMENTS

| | | |
|---|---|---|
| 8,432,741 B2 | 4/2013 | Lee |
| 8,476,708 B2 | 7/2013 | Fukuzumi et al. |
| 8,766,349 B2 * | 7/2014 | Park ...................... H10B 69/00 257/314 |
| 8,767,452 B2 | 7/2014 | Kito et al. |
| 9,236,394 B2 | 1/2016 | Rhie |
| 9,515,074 B2 | 12/2016 | Whang et al. |
| 9,922,717 B1 | 3/2018 | Maejima |
| 11,270,980 B2 * | 3/2022 | Tagami .................. H01L 25/50 |
| 2006/0148129 A1 | 7/2006 | Lim et al. |
| 2015/0099338 A1 | 4/2015 | Yoo |
| 2015/0263024 A1 | 9/2015 | Hishida et al. |
| 2016/0071870 A1 | 3/2016 | Minami et al. |
| 2016/0079164 A1 | 3/2016 | Fukuzumi et al. |

FOREIGN PATENT DOCUMENTS

| | | |
|---|---|---|
| JP | 2011-204829 | 10/2011 |
| JP | 2012-146861 | 8/2012 |
| JP | WO 2014/024611 | 2/2014 |
| JP | 2016-62901 | 4/2016 |
| TW | 201709486 A | 3/2017 |

* cited by examiner

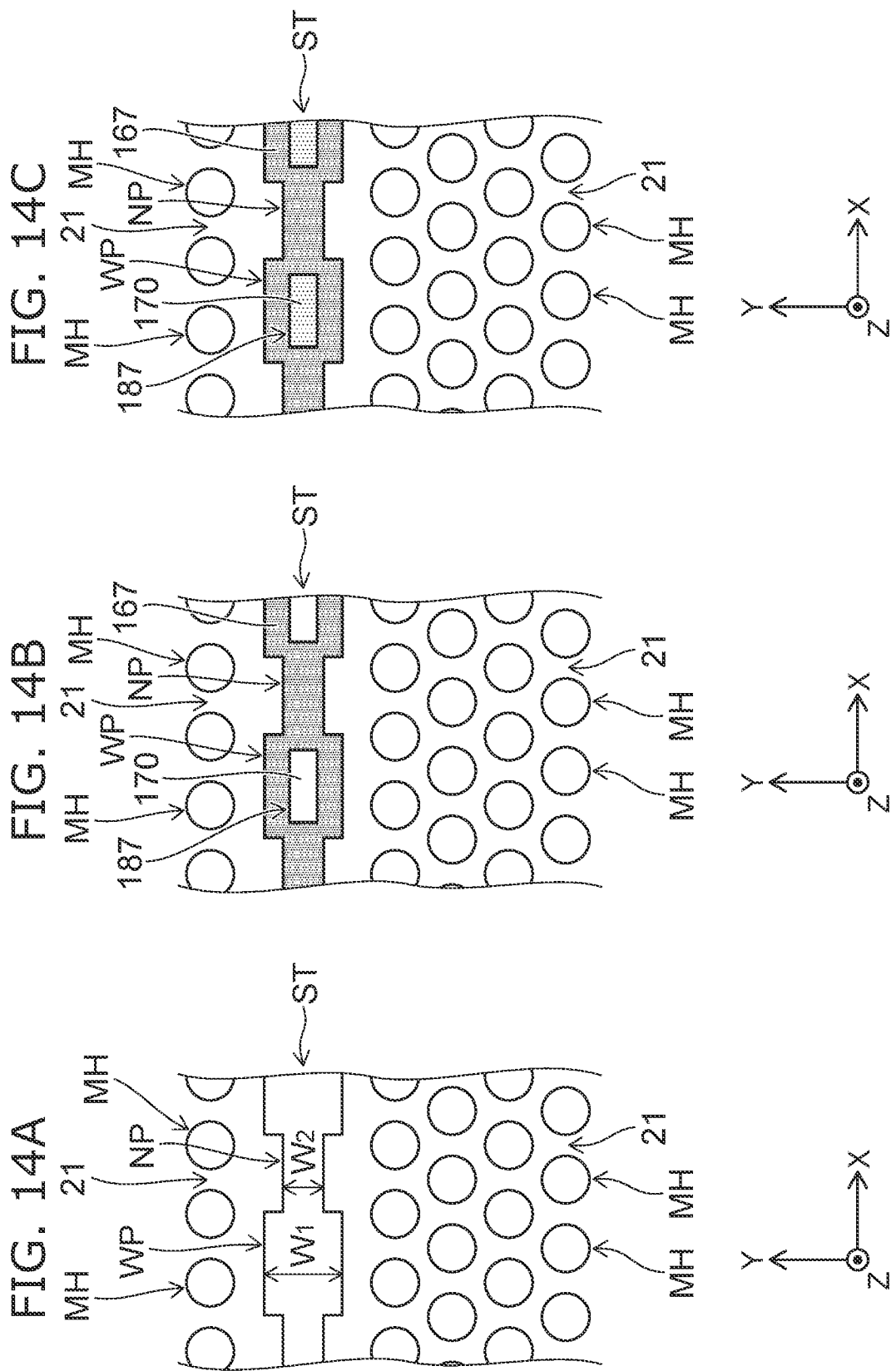

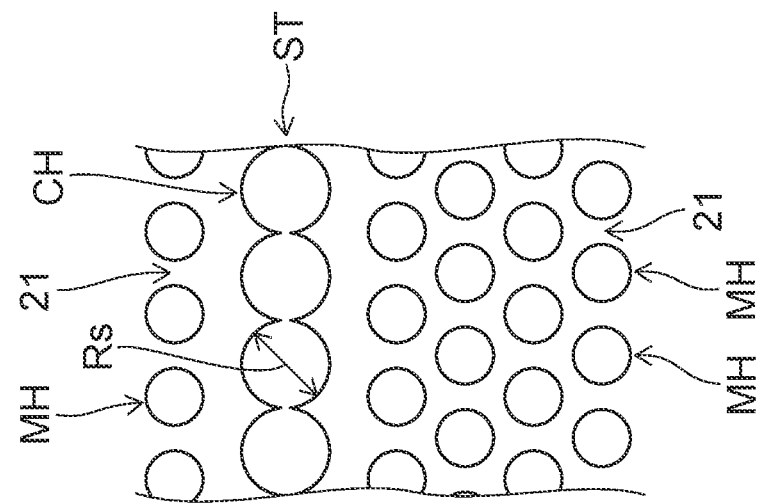
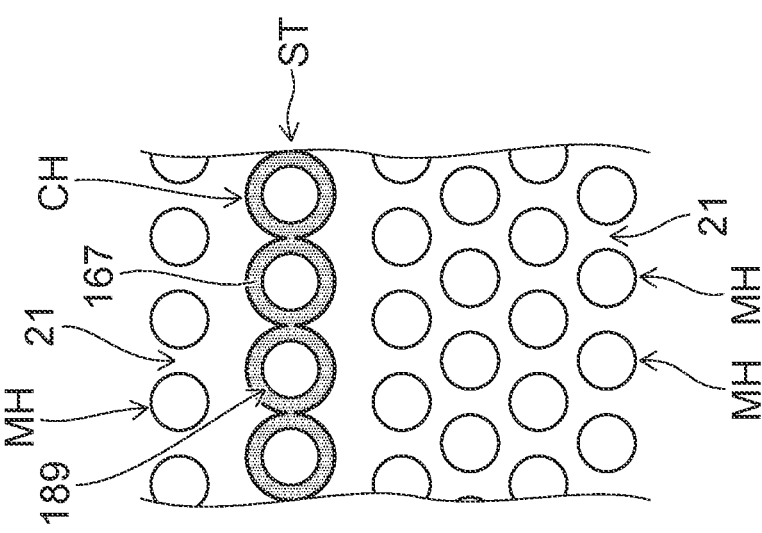
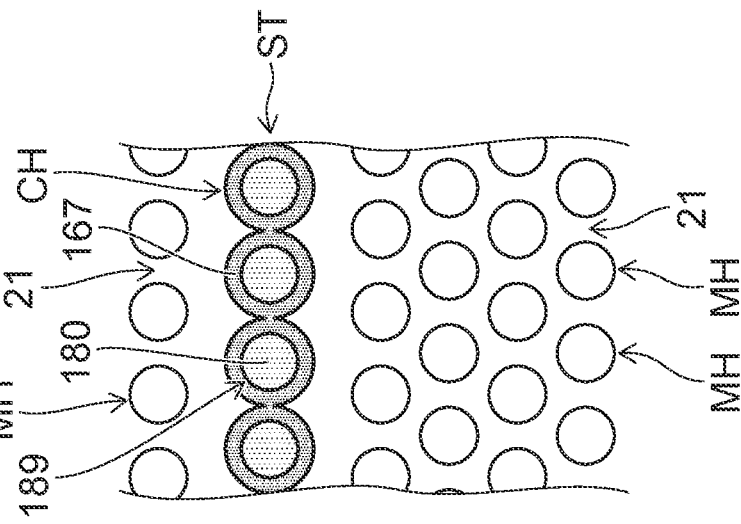

MEMORY DEVICE

CROSS-REFERENCE TO RELATED APPLICATIONS

This application is a continuation of U.S. application Ser. No. 16/916,979 filed Jun. 30, 2020, which is a continuation of U.S. application Ser. No. 16/390,639 filed Apr. 22, 2019, which is a continuation of U.S. application Ser. No. 15/706,017, filed Sep. 15, 2017, which is based upon and claims the benefit of priority from Japanese Patent Application No. 2017-042675, filed on Mar. 7, 2017; the entire contents of each of which are incorporated herein by reference.

FIELD

Embodiments relate generally to a memory device.

BACKGROUND

A memory device is under developing, which includes memory cells disposed three-dimensionally. For example, a NAND type memory device includes a plurality of electrode layers stacked, and semiconductor pillars provided in the memory holes respectively. The memory holes extend through the plurality of electrode layers in a stacking direction, and the respective semiconductor pillars extend in a memory hole. Memory cells are provided in portions where a semiconductor pillar crosses the electrode layers, and the memory cells are disposed along the semiconductor pillar. In such a memory device, it is possible to enlarge the storage capacity by increasing the number of electrode layers stacked, and increasing the number of memory holes by shrinking. However, there may be limits in increasing the numbers of the memory holes and the electrode layers under the restricted size of the memory device chip.

BRIEF DESCRIPTION OF THE DRAWINGS

FIGS. 14A to 14C are schematic views showing a manufacturing process of the memory cell array of the memory device according to a variation of the second embodiment;

FIGS. 15A to 15C are schematic cross-sectional views showing a manufacturing process of the memory cell array according to another variation of the second embodiment;

DETAILED DESCRIPTION

Figure 1:
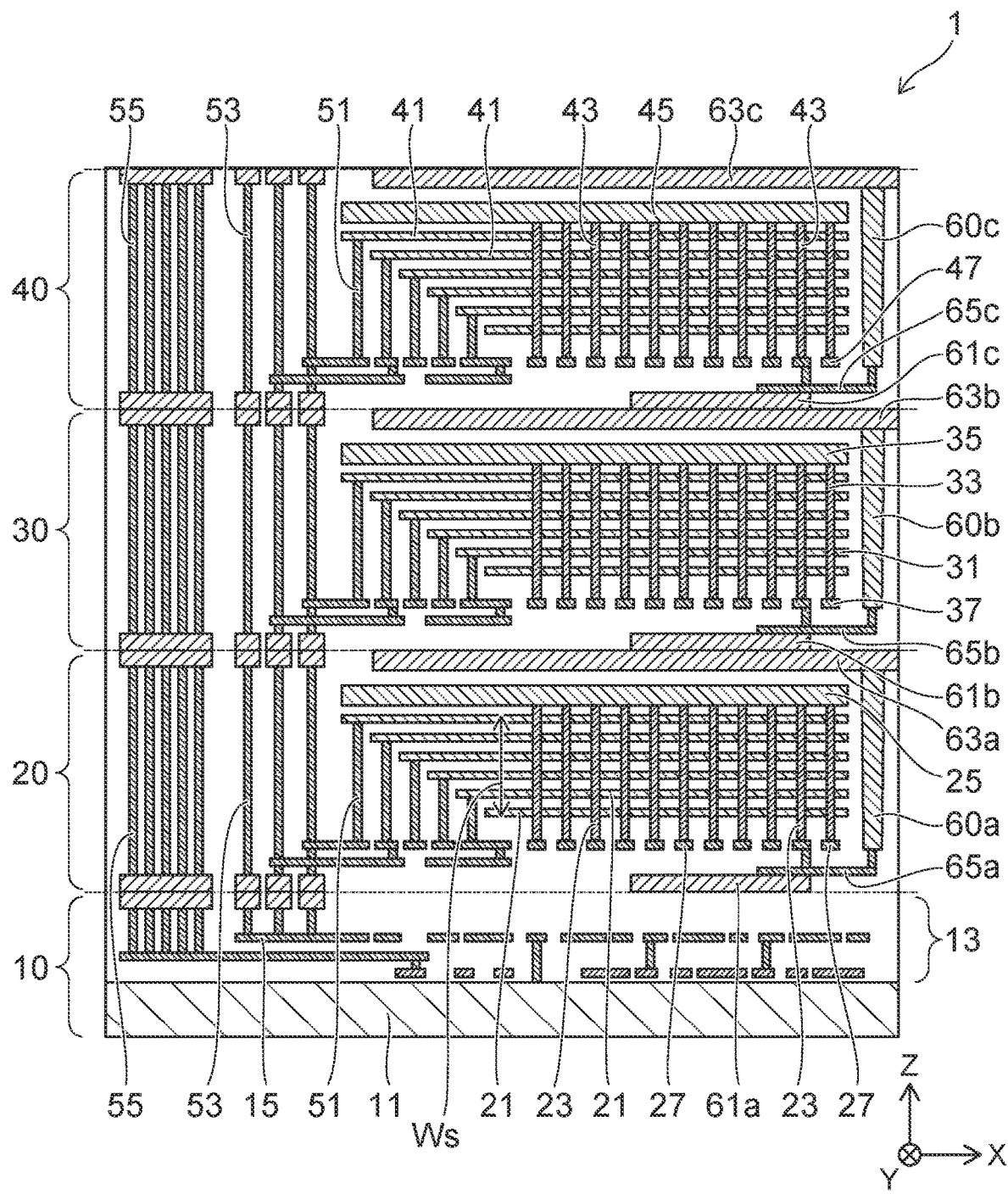
FIG. 1 is a schematic cross-sectional view showing a memory device according to a first embodiment.

According to one embodiment, a memory device includes a first memory cell array, a second memory cell array disposed in the first direction with respect to the first memory cell array, a first contact plug extending in the first direction through the first memory cell array, and a second contact plug extending in the first direction through the second memory cell array. The first memory cell array includes a plurality of first electrode layers stacked in a first direction, and a first semiconductor pillar extending through the plurality of first electrode layers in the first direction. The second memory cell array including a plurality of second electrode layers stacked in the first direction, and a second semiconductor pillar extending in the first direction through the plurality of second electrode layers. The first contact plug is electrically connected to the first semiconductor pillar, and the second contact plug is electrically connected to the second semiconductor pillar and the first contact plug.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a memory device 1 according to a first embodiment. The memory device 1 is, for example, a NAND-type flash memory device, and has a structure in which memory cell arrays 20, 30 and 40 are stacked on a drive circuit 10. It should be noted that insulating films provided between the components are omitted in FIG. 1 for convenience in showing a structure of the memory device 1.

The drive circuit 10 includes, for example, a substrate 11 and a multi-layer interconnection 13. Electronic devices such as CMOS transistors are provided on the substrate 11, and the multi-layer interconnection 13 provided on the substrate 11. The substrate 11 is, for example, a silicon substrate. A CMOS-type integrated circuit, for example, is provided on a side of the top surface of the substrate 11.

The memory cell array 20 includes a plurality of electrode layers 21 stacked in the Z-direction, a plurality of semiconductor pillars 23, and a source line 25. The semiconductor pillars 23 each extend in the Z-direction through the electrode layers 21. Each semiconductor pillar 23 is electrically connected to the source line 25 at one end. Each semiconductor pillar 23 shares the source line 25 with one another. Further, each semiconductor pillar 23 is electrically connected to an interconnection 27 at the other end.

The memory cell array 30 includes a plurality of electrode layers 31 stacked in the Z-direction, a plurality of semiconductor pillars 33, and a source line 35. The semiconductor pillars 33 extend in the Z-direction through the electrode layers 31. Each semiconductor pillar 33 is electrically connected to the source line 35 at one end. Each semiconductor pillar 33 shares the source line 35 with one another. Further, each semiconductor pillar 33 is electrically connected to an interconnection 37 in the other end.

The memory cell array 40 includes a plurality of electrode layers 41 stacked in the Z-direction, a plurality of semiconductor pillars 43, and a source line 45. The semiconductor pillars 43 extend in the Z-direction through the electrode layers 41. Each semiconductor pillar 43 is electrically connected to the source line 45 at one end. Each semiconductor pillar 43 shares the source line 45 with one another. Further, each semiconductor pillar 43 is electrically connected to an interconnection 47 in the other end.

The electrode layers 21, 31 and 41 are electrically connected to contact plugs 51 respectively in the end portions formed into steps. Further, the electrode layers 21, 31 and 41 are electrically connected to the drive circuit 10 via the contact plugs 51 and contact plugs 53, The contact plugs 53 are provided so as to extend through the memory cell arrays 20, 30 and 40. The contact plugs 53 electrically connect the electrode layers 21, 31 and 41 in the memory cell arrays stacked on the drive circuit 10 to interconnections 15 in the mufti-layer interconnection 13.

Further, other contact plugs 55 are provided in the memory cell arrays so as to extend through the memory cell arrays. The contact plugs 55 electrically connect the drive circuit 10, for example, to an interface circuit (not shown).

The memory device 1 further includes contact plugs 60 extending in the Z-direction through the respective memory cell arrays. A contact plug 60, for example, is provided in each memory cell array so as to extend through the plurality of electrode layers 21, 31 or 41. The contact plug 60 extends, for example, with a length longer than a total width Ws in the Z-direction of electrode layers stacked in the Z-direction in each memory cell array. The contact plugs 60 each include metal such as tungsten.

As shown in FIG. 1, the memory cell array 20 includes a contact plug 60*a*, and the memory cell arrays 30 and 40 include contact plugs 60*b* and 60*c* respectively. It should be noted that the contact plugs 60*a*, 60*b* and 60*c* are collectively referred to as the contact plugs 60 in some cases. Other components are also referred to in the same manner.

Further, connection pads 61 and 63 are provided in the respective memory cell arrays. The connection pad 61 is provided on a bottom surface of each memory cell array, and the connection pad 63 is provided on a top surface of each memory cell array.

As shown in FIG. 1, the connection pad 63*a* and the connection pad 61*b* are disposed at a boundary between the memory cell array 20 and the memory cell array 30, and the memory cell arrays 20 and 30 are connected to each other. The contact plug 60*a* is electrically connected to the connection pad 63*a*. The contact plug 60*b* is electrically connected via an interconnection 65*b* to the connection pad 61*b*. That is, the contact plug 60*a* and the contact plug 60*b* are electrically connected via the connection pads 63*a* and 61*b*.

Similarly, connection pads 63*b* and 61*c* are disposed at a boundary between the memory cell array 20 and the memory cell array 30, connecting the memory cell arrays 20 and 30. The contact plugs 60*b* and 60*c* are electrically connected via the connection pads 63*b* and 61*c*.

In the memory cell array 20, a semiconductor pillar 23 is connected to an interconnection 27, and the interconnection 27 is connected to an interconnection 65*a*, Further, the interconnection 65*a* is electrically connected to the contact plug 60*a*, Similarly, in the memory cell array 30, an interconnection 37 connected to a semiconductor pillar 33 is electrically connected to the contact plug 60*b* and the connection pad 61*b* via an interconnection 65*b*, In the memory cell array 40, an interconnection 47 connected to a semiconductor pillars 43 are electrically connected to the contact plug 60*c* and the connection pad 61*c* via an interconnection 65*c*.

As described above, it is possible to connect the semiconductor pillars, which are included in the respective memory cell arrays stacked on the drive circuit 10, to each other via the contact plugs 60. It should be noted that the semiconductor pillars connected to each other via the contact plugs 60 are connected to, for example, a sense amplifier (not shown) of the drive circuit 10 via connection pads 61*a* located between the drive circuit 10 and the memory cell array 20, or via connection pads 63*c* provided on the top surface of the memory cell array 40, a interconnection (not shown) above the memory cell array 40, and the contact plugs 53.

In the embodiment, it is possible to connect the semiconductor pillars 23, 33 and 43 to each other, which are included in the memory cell arrays 20, 30 and 40 respectively, and to make the semiconductor pillars 23, 33 and 43 act, for example, as one memory string including memory cells MC (see FIG. 4) disposed along the respective semiconductor pillars.

When the number of electrode layers included in the respective memory cell arrays 20, 30 and 40 is 64, for example, it is possible in the memory device 1 to achieve the storage capacity equivalent to a memory cell array in which 192 electrode layers are stacked. For example, an extremely sophisticated wafer process technology is required to form the memory holes in the stacked body, which includes the 192 electrode layers continuously stacked, and form the semiconductor pillars in the memory holes respectively. In contrast, in the memory device 1, it is possible to easily achieve the storage capacity equivalent to the case where the 192 electrode layers are stacked continuously, by stacking the memory cell arrays 20, 30 and 40, which are individually formed, and then electrically connecting the memory cell arrays 20, 30 and 40 to each other with the contact plugs 60 and the connection pads 61, 63.

Moreover, when forming the semiconductor pillars extending through the 192 electrode layers, a cell current may be reduced due to electric resistance of the respective semiconductor pillars, thereby making it difficult to read data out from the memory cells. In the embodiment, the respective semiconductor pillars 23, 33 and 43 extend, for example, through the 64 electrode layers, and are connected in parallel to each other. Thus, each semiconductor pillar has electric resistance lower than that in a semiconductor pillar extending through the 192 electrode layers. Thereby, it is possible in the memory device 1 to suppress the reduction of the cell current.

It should be noted that the embodiment is not limited to the example described above, and, for example, the number of the memory cell arrays stacked above the drive circuit 1 may be two, or four or more memory cell arrays may be stacked thereover. Then, a structure of each memory cell array will be described in detail with reference to FIGS. 2A, 2B, 3 and 4.

Figure 2A:
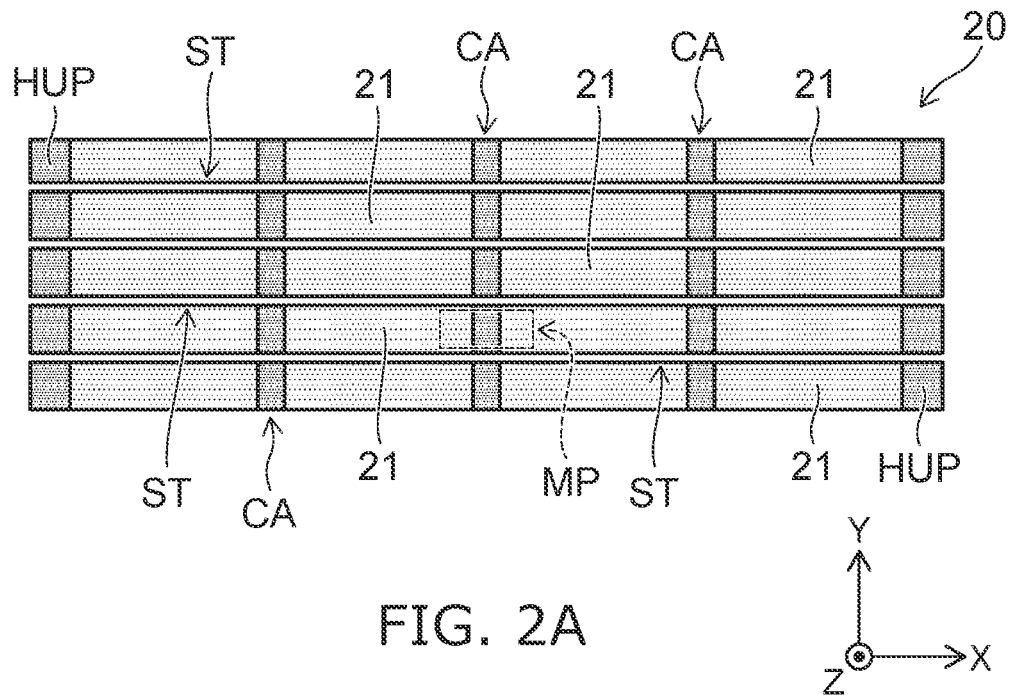
FIGS. 2A and 2B are schematic plan views showing a memory cell array of the memory device according to the first embodiment.
Figure 2B:
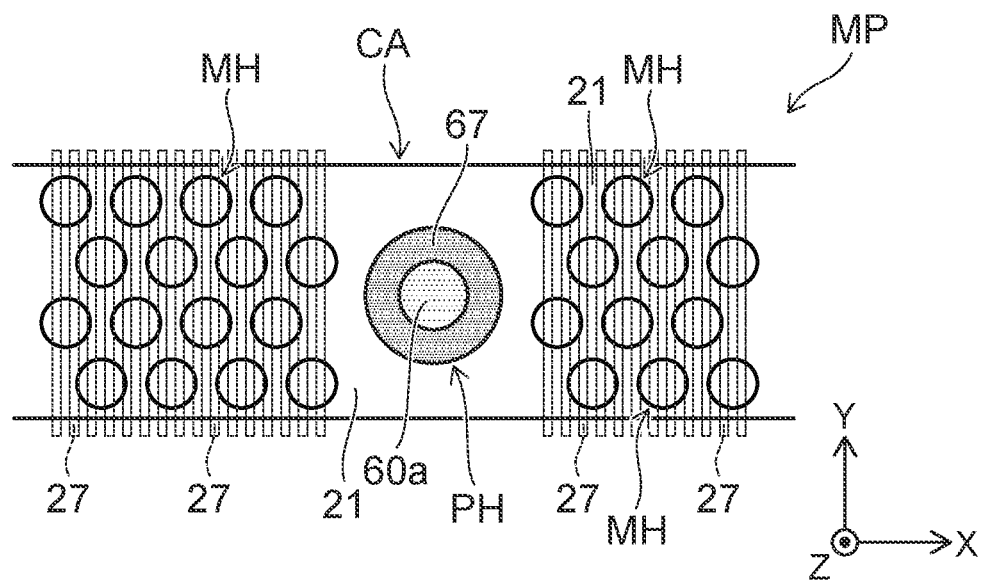

FIGS. 2A and 2B are schematic plan views showing the memory cell array 20 of the memory device 1 according to the first embodiment. FIG. 2B is a plan view showing an area MP shown in FIG. 2A. The memory cell arrays 30 and 40 each have a structure same as that of the memory cell array 20.

As shown in FIG. 2A, the electrode layers 21 extend in the X-direction. The electrode layers 21 are stacked in the Z-direction, and are also arranged in the Y-direction. A slit ST is provided between electrode layers 21 adjacent to each other in the Y-direction, and electrically separates the electrode layers from each other. A hook-up portion HUP is provided at an end in the X-direction of an electrode layer 21, where the end portions of the electrode layers 21 are formed into steps. Moreover, contact areas CA are provided in parts of the electrode layer 21 arranged in the X-direction.

As shown in FIG. 2B, a plurality of memory holes MH are provided in the electrode layer 21. The memory holes MH extend in the Z-direction through the electrode layers 21, and the semiconductor pillars 23 (see FIG. 1) are disposed in the memory holes MH respectively. Further, a plurality of interconnections 27 are provided so as to extend in the Y-direction. One of the semiconductor pillars 23 extending through the electrode layers 21 stacked in the Z-direction is connected to one of the interconnections 27. The one interconnection 27 is shared by the one semiconductor pillar 23 extending through the respective electrode layers 21 arranged in the V-direction.

Figure 3:
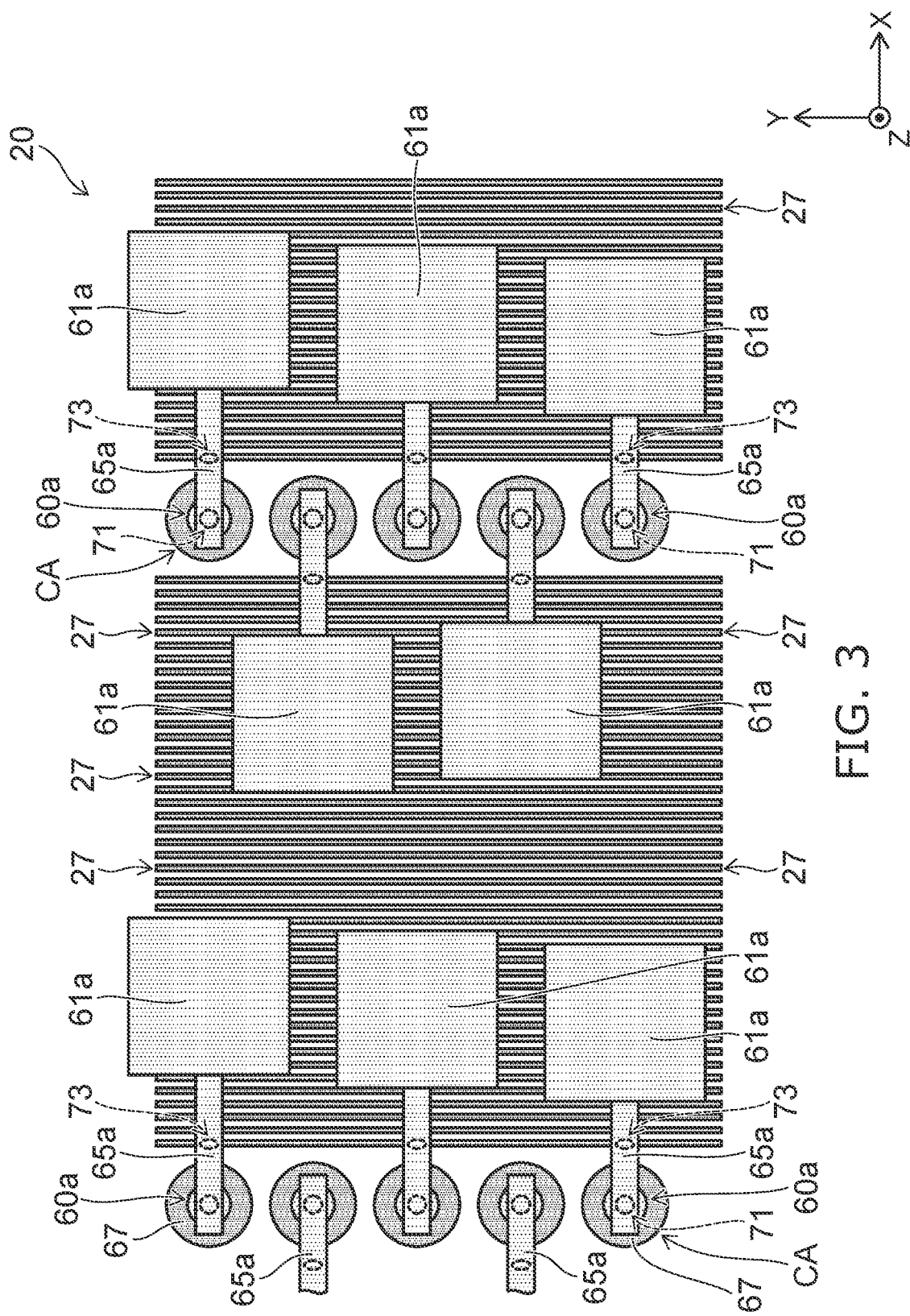
FIG. 3 is a schematic plan view showing a top surface of the memory cell array of the memory device according to the first embodiment.

A contact hole PH is provided in a contact area CA. The contact hole PH extends in the Z-direction through the plurality of electrode layers 21. As shown in FIG. 2B, the contact plug 60a is provided in the contact hole PH, The contact plug 60a includes the metal such as tungsten, and is electrically insulated from the electrode layers 21 by an insulating film 67 provided in the contact hole PH, The insulating film 67 is, for example, a silicon oxide film, FIG. 3 is a schematic plan view showing a bottom surface of the memory cell array 20, As shown in FIG. 3, the interconnections 27 are arranged in the X-direction between the contact areas CA. The interconnections 27 each extend in the Y-direction. Contact plugs 60a are arranged in the Y-direction in the contact area CA. Further, a plurality of connection pads 61a are disposed between the contact areas CA.

The connection pads 61a are provided on the interconnections 27, and are connected respectively to the contact plugs 60a via the interconnections 65a, For example, the number of the connection pads 61a disposed between the contact areas CA is the same as the number of the interconnections 27 disposed therebetween. An interconnection 65a is connected to a contact plug 60a via a contact plug 71. Further, the interconnection 65a is connected to one of the interconnections 27 via a contact plug 73.

Figure 4:
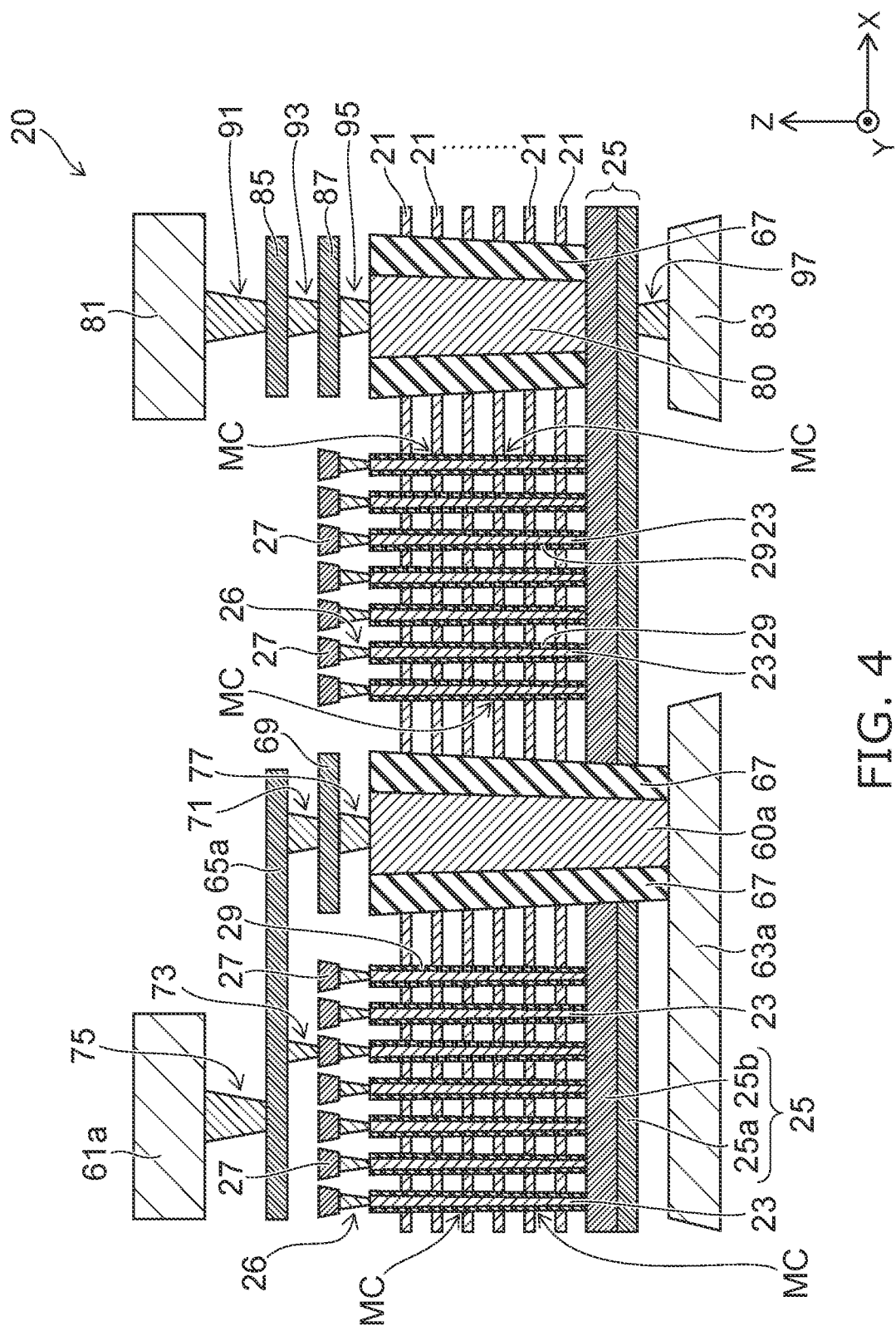
FIG. 4 is a schematic cross-sectional view showing the memory cell array of the memory device according to the first embodiment.

FIG. 4 is a schematic cross-sectional view showing the memory cell array 20. It should be noted that FIG. 4 is a cross-sectional view showing upside-down in FIG. 1, Further, insulating films electrically insulating the components from each other are appropriately omitted in FIG. 4 for convenience in showing the structure of the memory cell array 20.

As shown in FIG. 4, a plurality of electrode layers 21 are stacked on the source line 25. The source line 25 is, for example, a plate-like conductive layer extending in the X-direction and the Y-direction. The source line 25 has a structure, for example, including a metal layer 25a and a semiconductor layer 25b stacked. The metal layer 25a is, for example, a tungsten layer, and the semiconductor layer 25b is, for example, a polycrystalline silicon layer. The electrode layers 21 are metal layers each including, for example, tungsten.

The semiconductor pillars 23 each extend through the electrode layers 21 in the staking direction (the Z-direction), and are connected to the source line 25 at the bottom ends thereof. Moreover, the top ends of the semiconductor pillars 23 are electrically connected to the interconnections 27 via contact plugs 26 respectively.

A memory film 29 is provided between the electrode layers 21 and a semiconductor pillar 23. The memory film 29 has a structure, for example, including a first silicon oxide film, a silicon nitride film and a second silicon oxide film stacked in order in a direction from the respective electrode layers 21 toward the semiconductor pillar 23, and the memory film 29 is capable of storing electric charges therein, and discharging the electric charges therefrom. Memory cells MC are provided respectively in portions where the semiconductor pillar 23 extends through the respective electrode layer 21, and each memory cell includes a portion of the memory film 29 as a charge storage portion.

As shown in FIG. 4, a contact plug 60a extends in the Z-direction through the electrode layers 21 and the source line 25. The contact plug 60a is electrically insulated by the insulating film 67 from the electrode layers 21 and the source line 25.

The bottom end of the contact plug 60a is connected to the connection pad 63a. Further, the top end of the contact plug 60a is electrically connected to the interconnection 65a via an intermediate interconnection 69 and the contact plugs 71, 77. The intermediate interconnection 69 is provided, for example, at a level same as the interconnections 27. The contact plug 77 connects the contact plug 60a and the intermediate interconnection 69. The contact plug 71 connects the interconnection 65a and the intermediate interconnection 69. Further, the interconnection 65a is connected to one of the interconnections 27 via the contact plug 73, and is electrically connected to the connection pad 61a via a contact plug 75.

The memory cell array 20 further includes a contact plug 80 electrically connected to the source line 25. The contact plug 80 extends in the Z-direction through the electrode layers 21. The contact plug 80 is provided, for example, in the contact area CA with the contact plugs 60a.

A bottom end of the contact plug 80 is connected to the source line 25. Further, a top end of the contact plug 80 is electrically connected to a contact pad 81 via intermediate interconnections 85, 87 and contact plugs 91, 93 and 95. The intermediate interconnections 85 and 87 are provided at levels same levels as the interconnections 65a and 27 respectively. The contact plug 91 connects the contact plug 80 and the intermediate interconnection 87. The contact plug 93 connects the intermediate interconnection 85 and the intermediate interconnection 87, Further, the intermediate interconnection 85 is electrically connected to the connection pad 81 via the contact plug 91. Further, the source line 25 is electrically connected, for example, to a connection pad 83 via a contact plug 97.

The respective memory cell arrays 30 and 40 also include the contact plugs 80 and the connection pads 81 and 83 as well. When stacking the memory cell arrays 20, 30 and 40 as shown in FIG. 1, the respective source lines 25, 35 and 45 are electrically connected via the contact plug 80 and the connection pads 81 and 83. That is, a connection pad 83 of the memory cell array 20 and a connection pad 81 of the memory cell array 30 are connected at a boundary between the memory cell array 20 and the memory cell array 30. Further, a connection pad 83 of the memory cell array 30 and a connection pad 81 of the memory cell array 40 are connected at a boundary between the memory cell array 30 and the memory cell array 40.

Then, a method of manufacturing the memory device 1 according to the first embodiment will be described with reference to FIG. 5A to FIG. 10. FIG. 5A to FIG. 10 are schematic cross-sectional views showing the manufacturing process of the memory cell arrays 20, 30 and 40 stacked above the drive circuit 10.

Figure 5A:
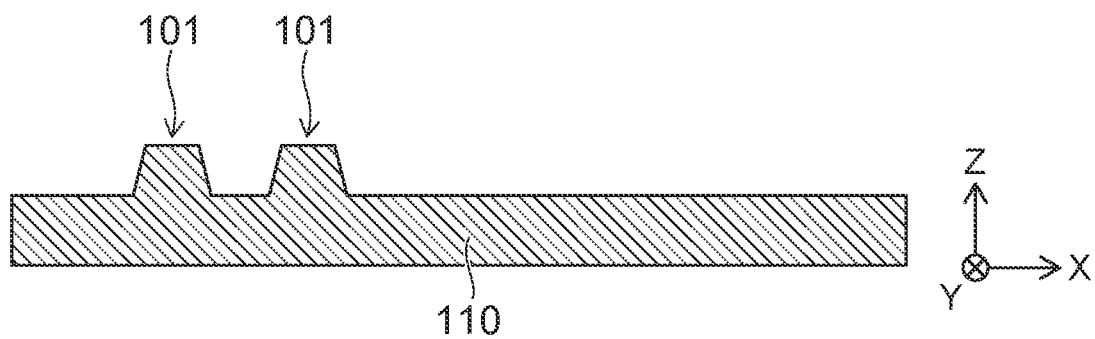
FIGS. 5A to 8B, FIGS. 9 and 10 are schematic cross-sectional views showing a manufacturing process of the memory cell arrays of the memory device according to the first embodiment.
Figure 5B:
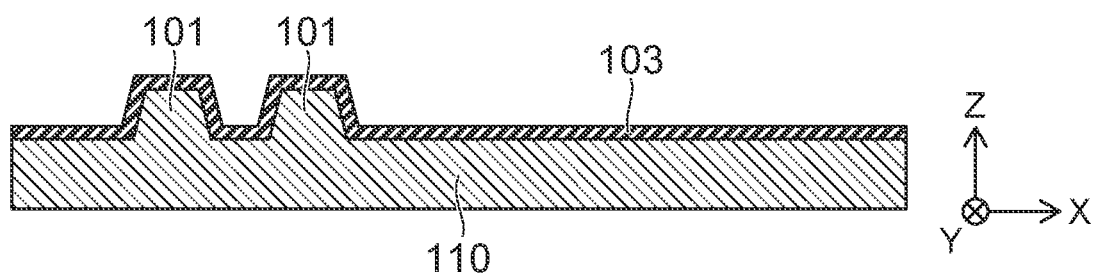

As shown in FIG. 5A, a substrate 110 having protruding portions 101 on a top surface thereof is formed. The protruding portions 101 are formed, for example, by selectively etching the substrate 110. The substrate 110 is, for example, a silicon substrate.

As shown in FIG. 56, an insulating film 103 is formed to cover the top surface of the substrate 110. The insulating film 103 is, for example, a silicon nitride film formed using LPCVD (Low Pressure Chemical Vapor Deposition).

Figure 5C:
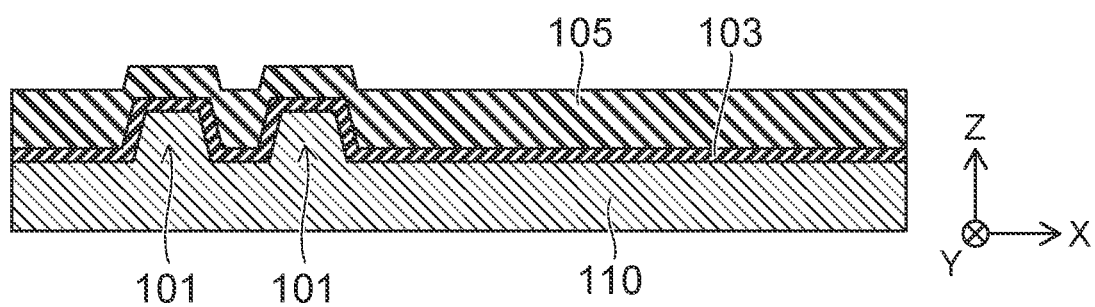

As shown in FIG. 5C, an insulating film 105 is formed on the insulating film 103. The insulating film 105 is, for example, a silicon oxide film formed using CVD that uses TEOS (Tetraethyl orthosilicate) as a raw material.

Figure 5D:
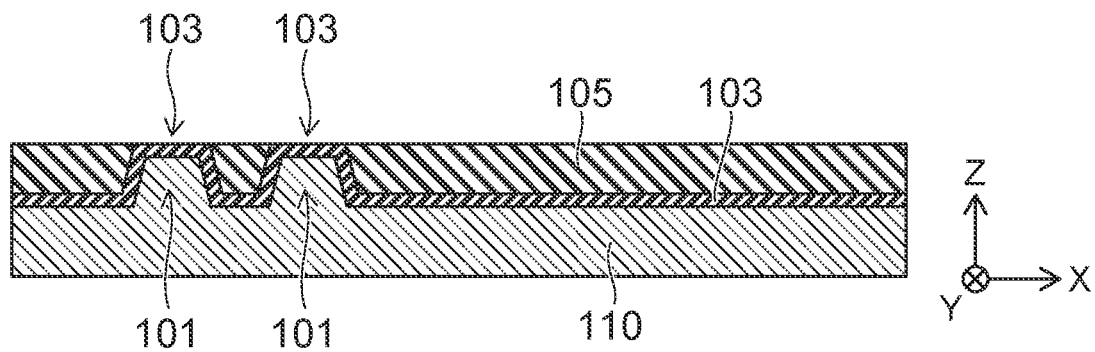

As shown in FIG. 5D, the insulating film 105 is planarized to partially expose the insulating film 103 formed on the protruding portions 101. The insulating film 105 is planarized, for example, using CMP (Chemical Mechanical Polishing).

Figure 6A:
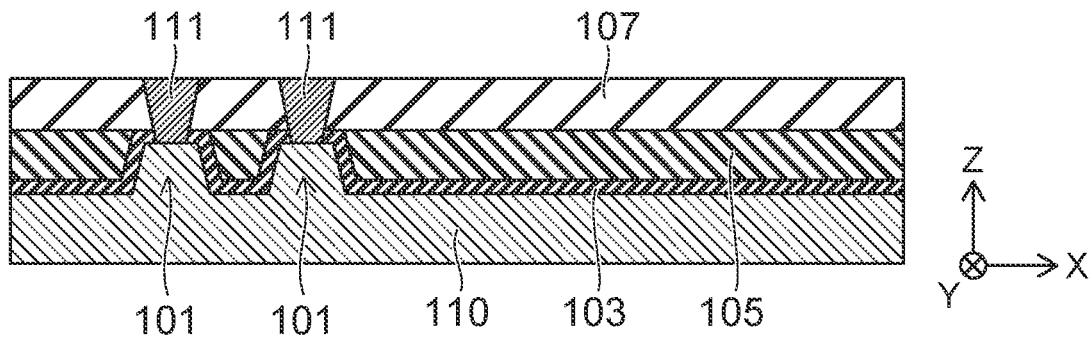

As shown in FIG. 6A, an insulating film 107 is formed on the insulating film 105 and the protruding portions 101. The insulating film 107 is, for example, a silicon oxide film formed using TEOS-CVD. Subsequently, contact plugs 111 are formed from a top surface of the insulating film 107 so as to reach the protruding portions 101 respectively.

Figure 6B:
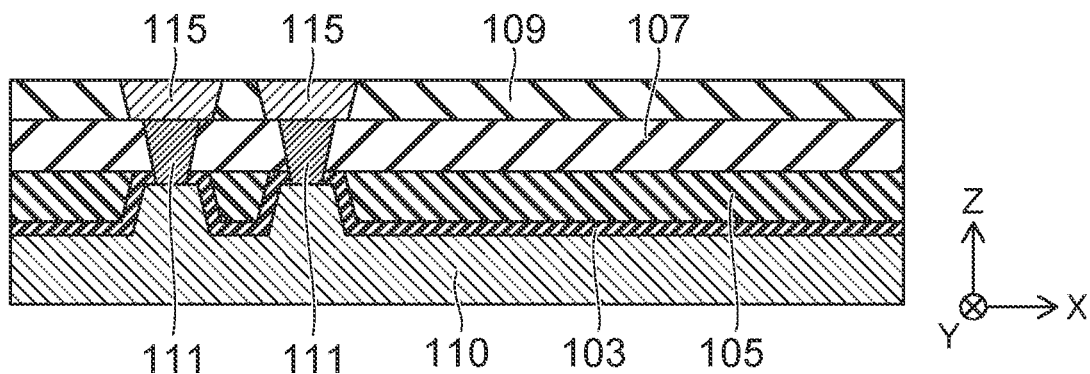

As shown in FIG. 6B, an insulating film 109 is formed on the insulating film 107. The insulating film 109 is, for example, a silicon oxide film formed using TEAS-CVD. Subsequently, the insulating film 109 is selectively removed to form interconnections 115. The interconnections 115 are electrically connected to the substrate 110, for example, via the contact plugs 111 respectively.

Figure 6C:
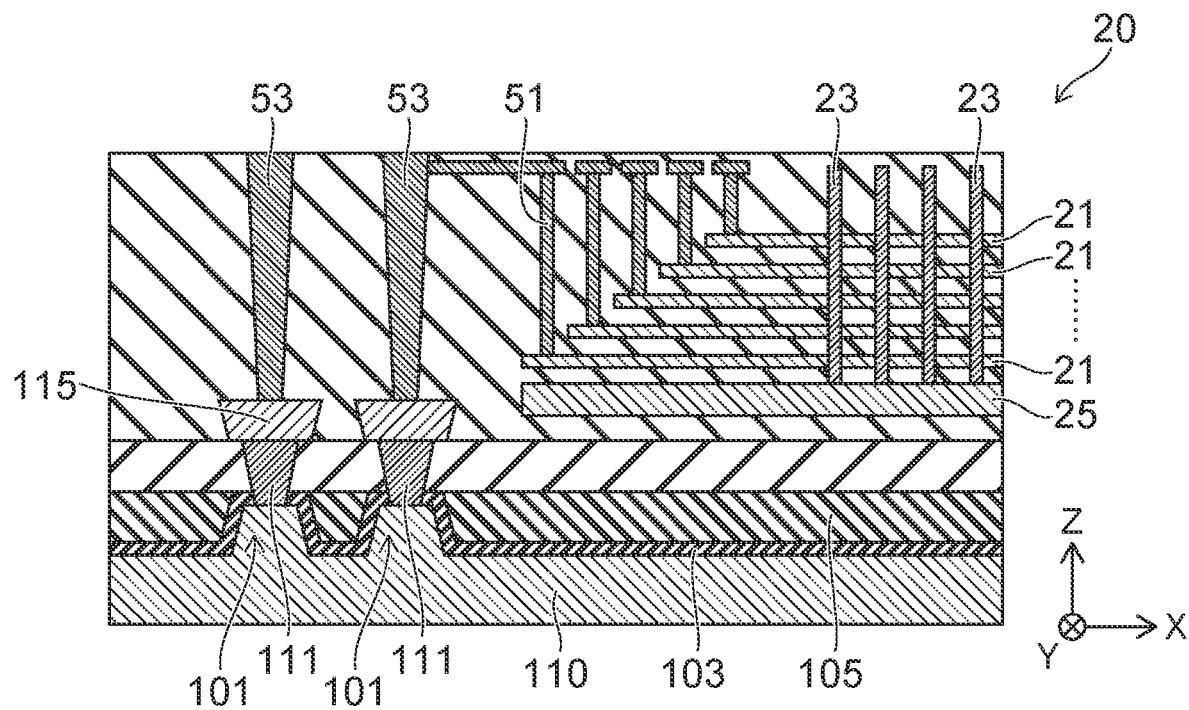

As shown in FIG. 6C, the memory cell array 20 is formed on the insulating film 109. The memory cell array 20 includes the plurality of electrode layers 21 stacked on one another in the Z-direction, the plurality of semiconductor pillars 23 penetrating the electrode layers 21 in the Z-direction, and the source line 25. Further, the memory cell array 20 includes the contact plugs 51 connected to the electrode layers 21 respectively, and the contact plugs 53 connected to the interconnections 115 respectively. Further, the contact plugs 60a and 80 are formed in a portion not shown in the drawing.

Figure 7A:
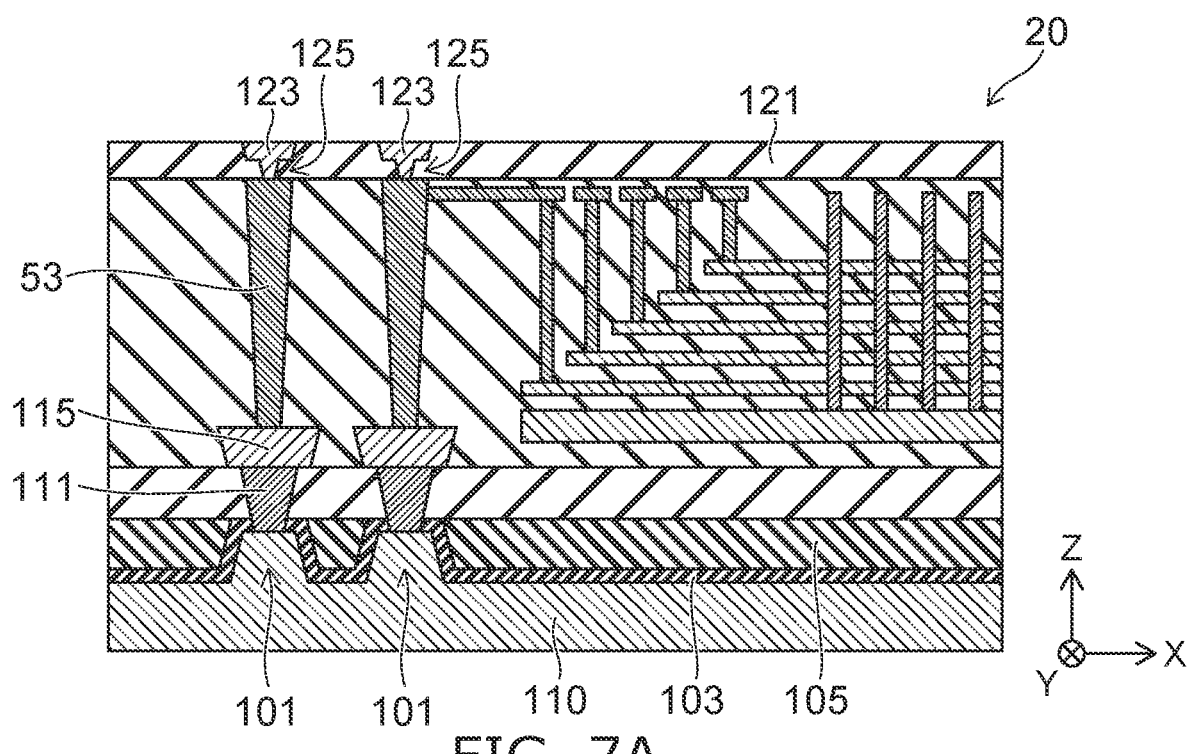

As shown in FIG. 7A, an insulating film 121 is formed on the memory cell array 20. The insulating film 121 is, for example, a silicon oxide film formed using TEOS-CVD. Subsequently, connection pads 123 are formed in the insulating film 121. The connection pads 123 are electrically connected to the contact plug 53, for example, via contact plugs 125 respectively. Further, the connection pads 61a and 81 (see FIG. 4) are also formed at the same time in a part not shown in the drawing. The connection pads 61a, 81 and 123 each include, for example, copper or copper alloy.

Figure 7B:
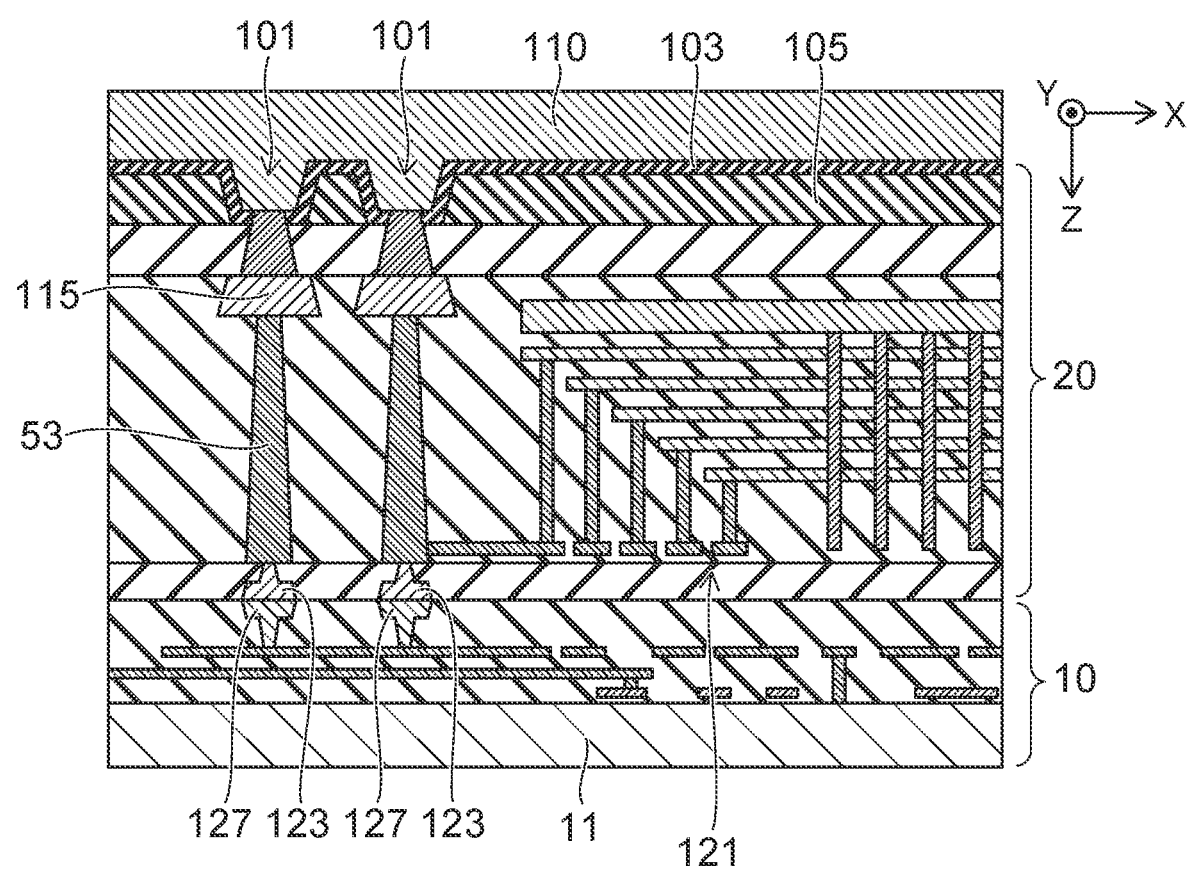

As shown in FIG. 7B, the memory cell array 20 are bonded to the drive circuit 10. For example, the top surface of the insulating film 121 and the top surface of the drive circuit 10 are made to be in contact with each other, and then, the insulating film 121 and the drive circuit 10 are bonded to each other under a temperature in a range of 300° C. to 400° C. and predetermined pressure. Then, the connection pads 123 are connected to connection pads 127 of the drive circuit 10 respectively. The connection pads 127 each include, for example, copper or copper alloy.

Figure 8A:
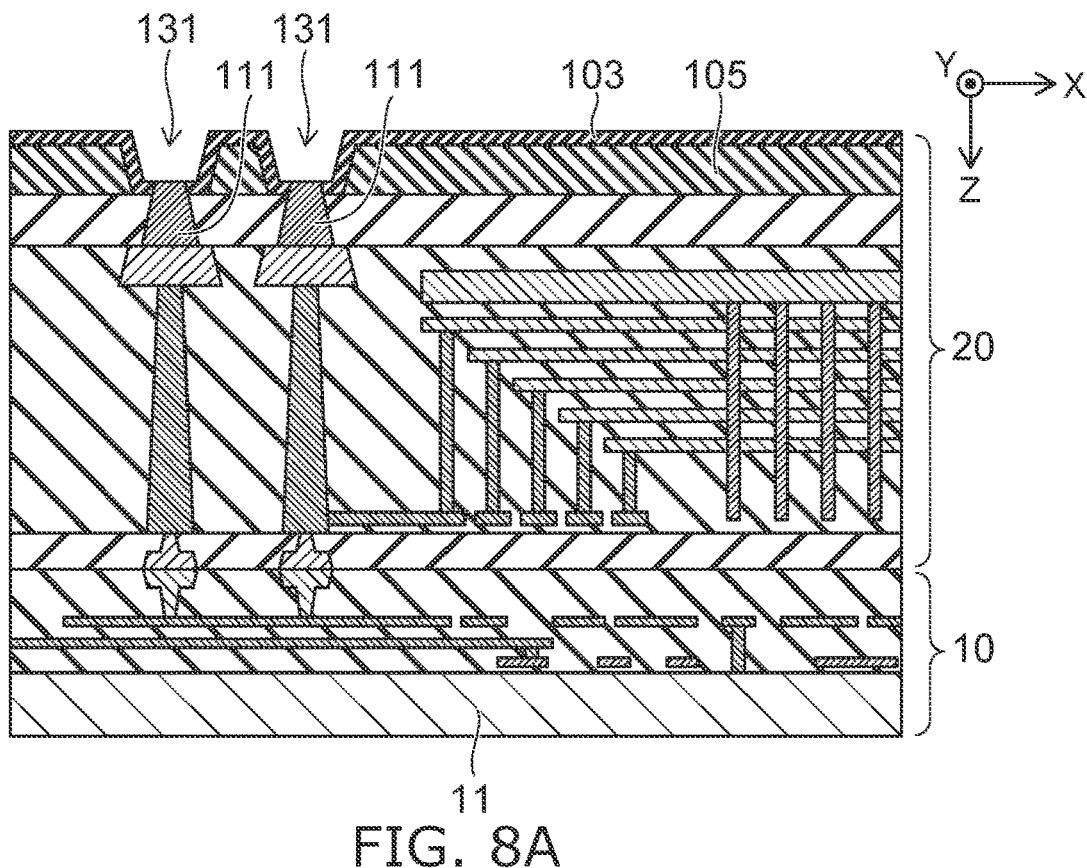

As shown in FIG. 8A, the substrate 110 is removed. For example, after the substrate 110 is thinned by polishing or grounding on the back surface side, the substrate 110 is selectively removed by wet etching. Thereby, recessed parts 131 are formed, and the insulating film 103 is exposed after the protruding portions 101 are removed. The top surfaces of the contact plugs 111 are exposed on the bottom surfaces of the recessed parts 131, respectively.

Figure 8B:
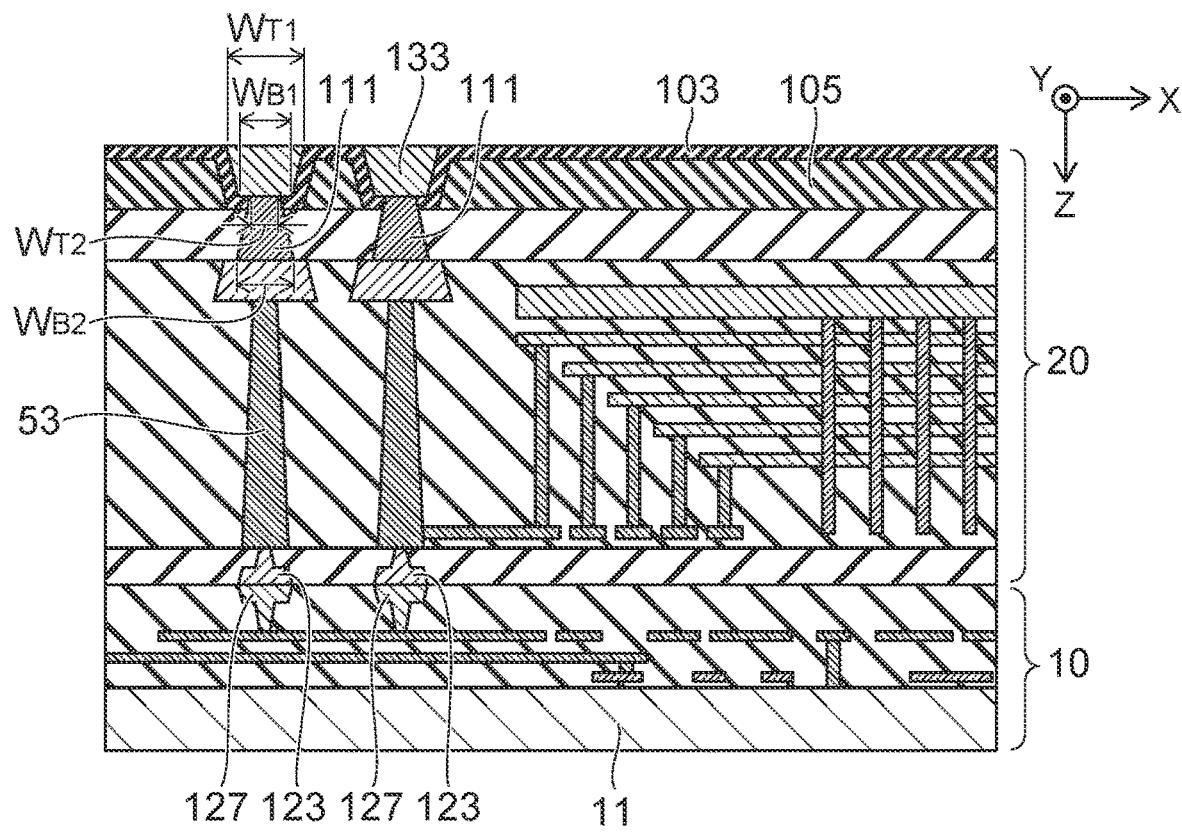

As shown in FIG. 8B, connection pads 133 are formed by filling the inside of each of the recessed parts 131 with the metal such as copper or copper alloy. Then, the connection pads 63a and 83 are also formed at the same time in a part not shown in the drawing.

The connection pads 133 are connected, for example, to the contact plugs 111, respectively. The connection pads 133 each have, for example, a shape in which a width WT1 of the top surface is wider than a width WB1 of the bottom surface. In contrast, the contact plugs 111 each have a shape in which a width WT2 of the top surface is narrower than a width WB2 of the bottom surface.

Figure 9:
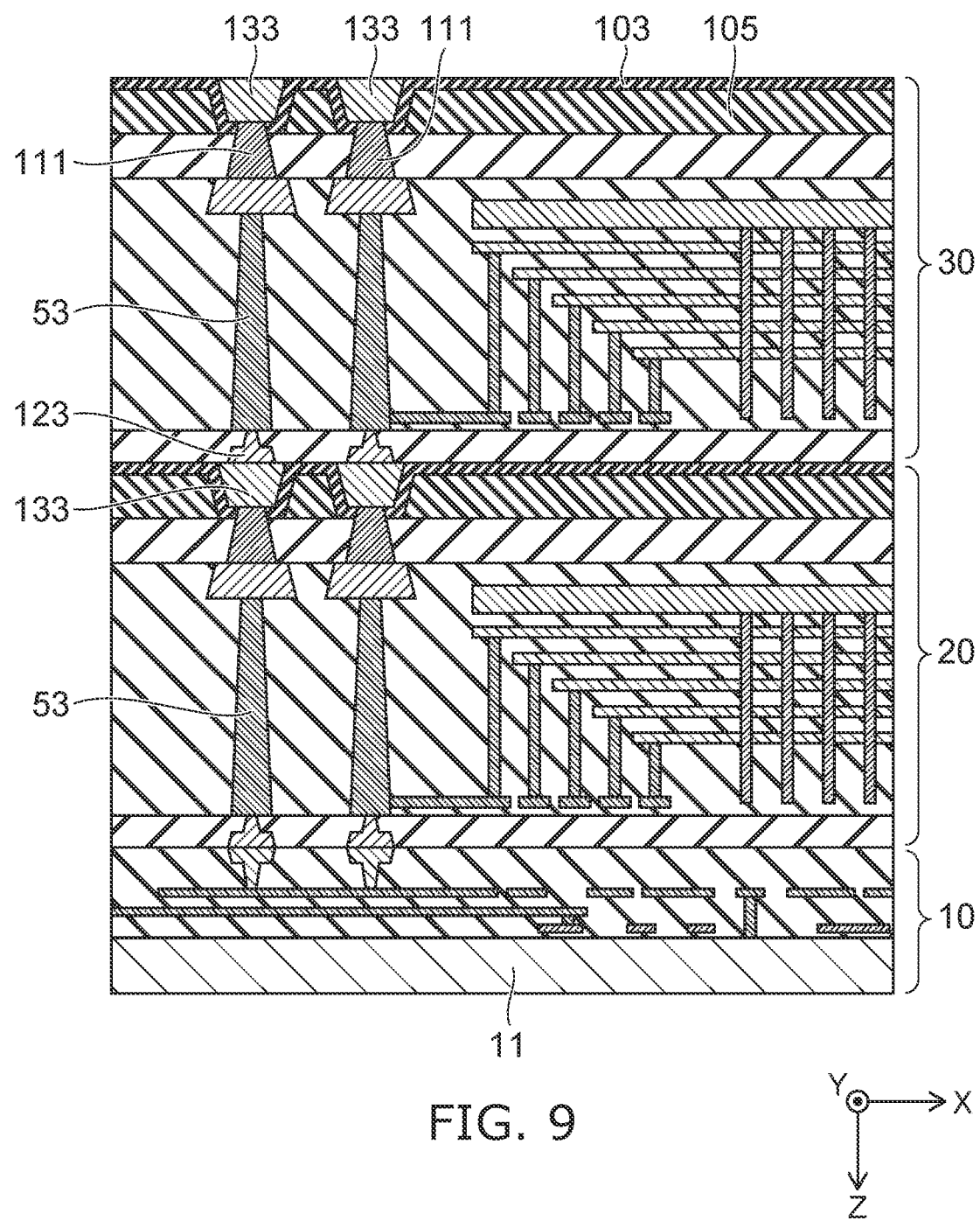

As shown in FIG. 9, the memory cell array 30 is bonded on the memory cell array 20. The memory cell array 30 is formed by a method same as that of the memory cell array 20. In FIG. 9, the connection pads 133 are formed on a top surface of the memory cell array 30. The connection pads 123 are connected to the connection pads 133 respectively at a boundary of the memory cell array 20 and the memory cell array 30. Further, the connection pads 61b of the memory cell array 30 is connected to the connection pads 63a of the memory cell array 20 (see FIG. 1) in a part not shown in the drawing. Further, the connection pad 81 of the memory cell array 30 is connected to the connection pad 83 of the memory cell array 20 (see FIG. 4), and thus, the source line 35 is electrically connected to the source line 25.

Figure 10:
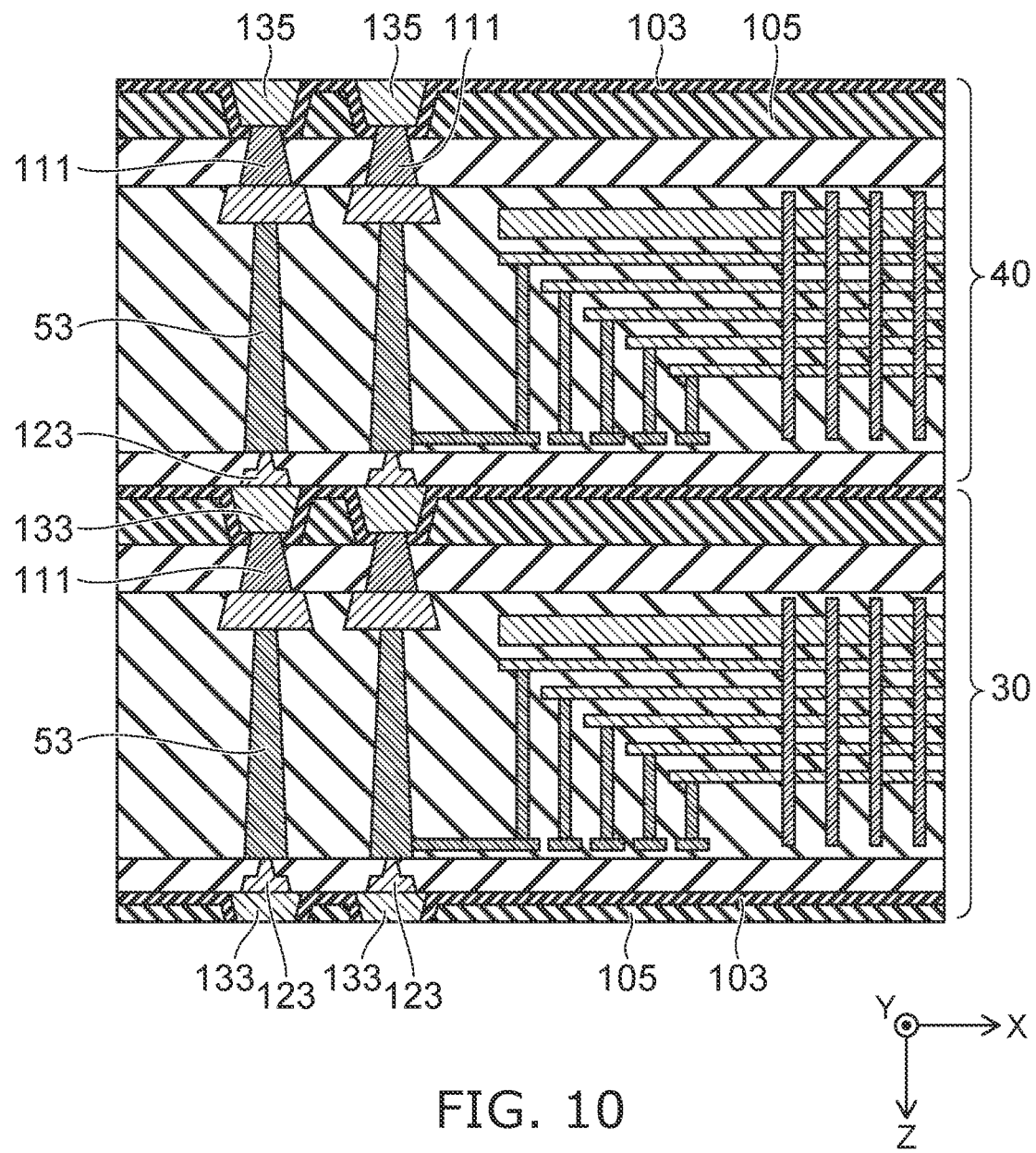

As shown in FIG. 10, the memory cell array 40 is bonded on the memory cell array 30. The memory cell array 40 is formed by a method same as those of the memory cell arrays 20 and 30. In FIG. 10, connection pads 135 are formed on a top surface side of the memory cell array 40. The connection pads 135 include, for example, aluminum. That is, the connection pads 135 are the interconnections at the uppermost level, and are formed, for example, to be capable of being connected to an external circuit by wire bonding.

As shown in FIG. 10, the connection pads 123 are connected to the connection pads 133 at the boundary of the memory cell array 30 and the memory cell array 40. Further, the connection pads 61c of the memory cell array 40 are connected to the connection pads 63b of the memory cell array 30 respectively (see FIG. 1) in a part not shown in the drawing. Further, the connection pad 81 of the memory cell array 40 is connected to the connection pad 83 of the memory cell array 30 (see FIG. 4), and thus the source line 45 is electrically connected to the source line 35.

In the manufacturing process described above, it is possible to form the connection pads on the top surface of each memory cell array by providing the protruding portions 101 on the top surface of the substrate 110 after the memory cell arrays are bonded. Further, when the protruding portions 101 are formed with interconnection patterns, it is possible to form the connection pads and interconnections connected thereto. Thus, it is possible to omit photolithography and etching of insulating films after the bonding, and thus, the manufacturing process of the memory device 1 is simplified.

Second Embodiment

Figure 11:
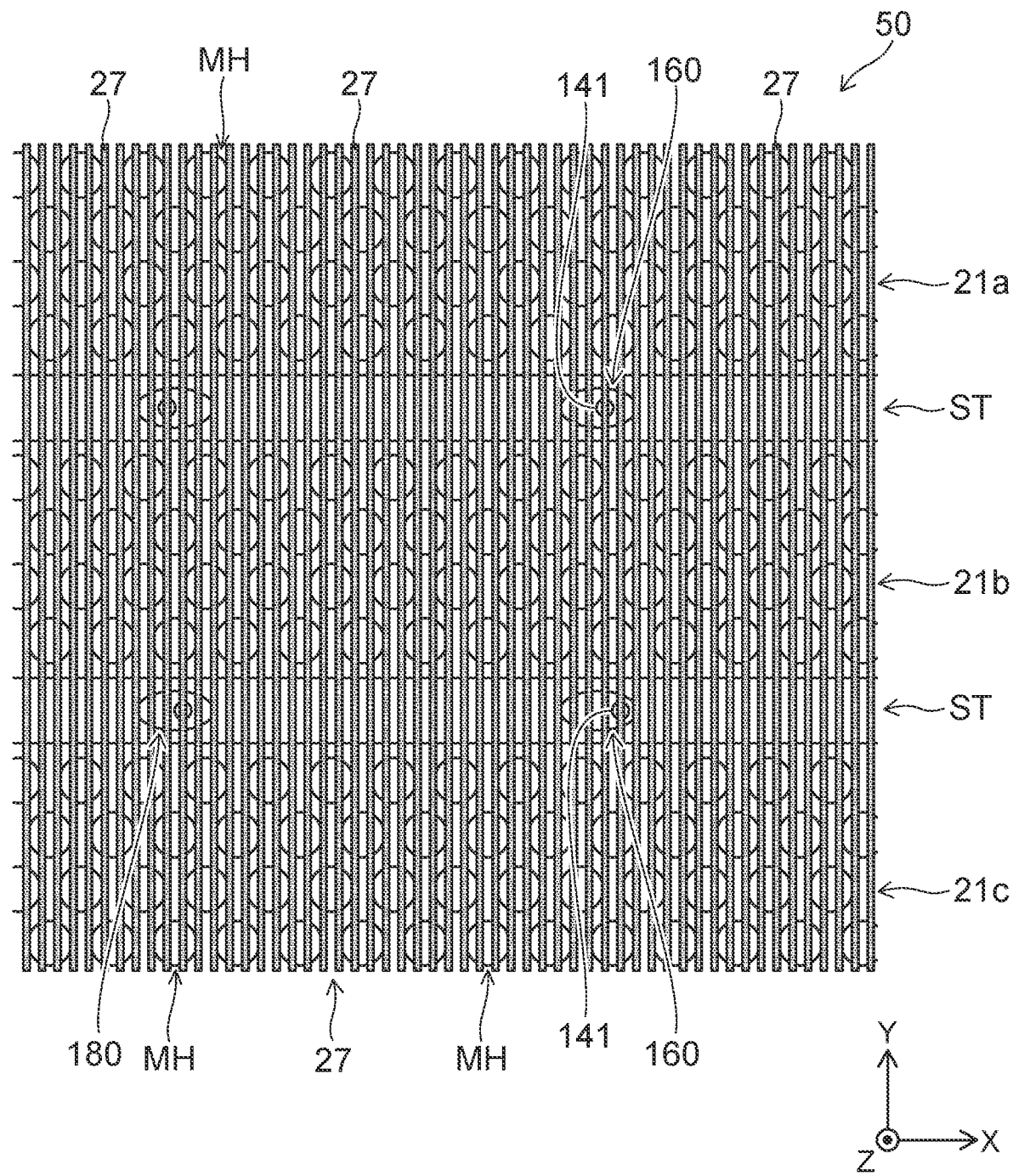
FIG. 11 is a schematic plan view showing a memory cell array of a memory device according to a second embodiment.

FIG. 11 is a schematic plan view showing a memory cell array 50 of a memory device according to a second embodiment. The memory cell array 50 includes electrode layers 21a, 21b and 21c arranged in the Y-direction. The electrode layers 21a, 21b and 21c each extend in the X-direction, and the electrode layers 21a and the electrode layers 21b are separated from each other by a slit ST, and the electrode layers 21b and the electrode layers 21c are separated from each other by another slit ST. Further, the electrode layers 21a, 21b and 21c are each stacked in the Z-direction, and a plurality of memory holes MH extend in the Z-direction through each of electrode layers 21a, 21b and 21c. A semiconductor pillar 23 (not shown) is disposed in each memory holes MH.

The memory cell array 50 includes a plurality of interconnections 27 extending over the electrode layers 21a, 21b and 21c in the Y-direction. The interconnections 27 are arranged, for example, in the X-direction. Each interconnection 27 is electrically connected to one of the semiconductor pillars extending through the electrode layers 21a, one of the semiconductor pillars extending through the electrode layers 21b, and one of the semiconductor pillars extending through the electrode layers 21c.

In this example, contact plugs 160 are disposed in the slits ST. The contact plugs 160 extend in the Z-direction, and the length of each contact plug 160 is longer than the total height of each of the electrode layers 21a, 21b and 21c stacked in the Z-direction. Further, the contact plugs 160 are each electrically connected to one of the interconnections 27 via a contact plug 141. Thus, the contact plugs 160 are provided in the slits ST so that the number of the contact plugs 160 is same as the number of the interconnections 27.

Figure 12A:
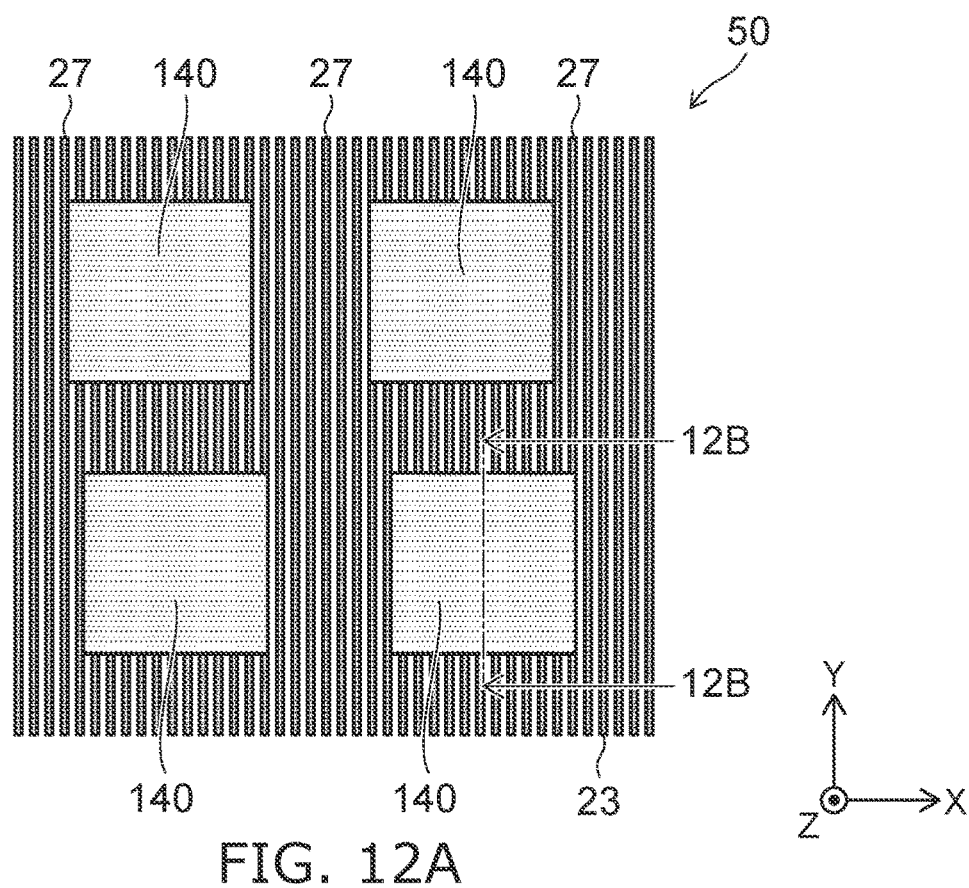
FIGS. 12A and 12B are schematic views showing the memory cell array of the memory device according to the second embodiment.
Figure 12B:
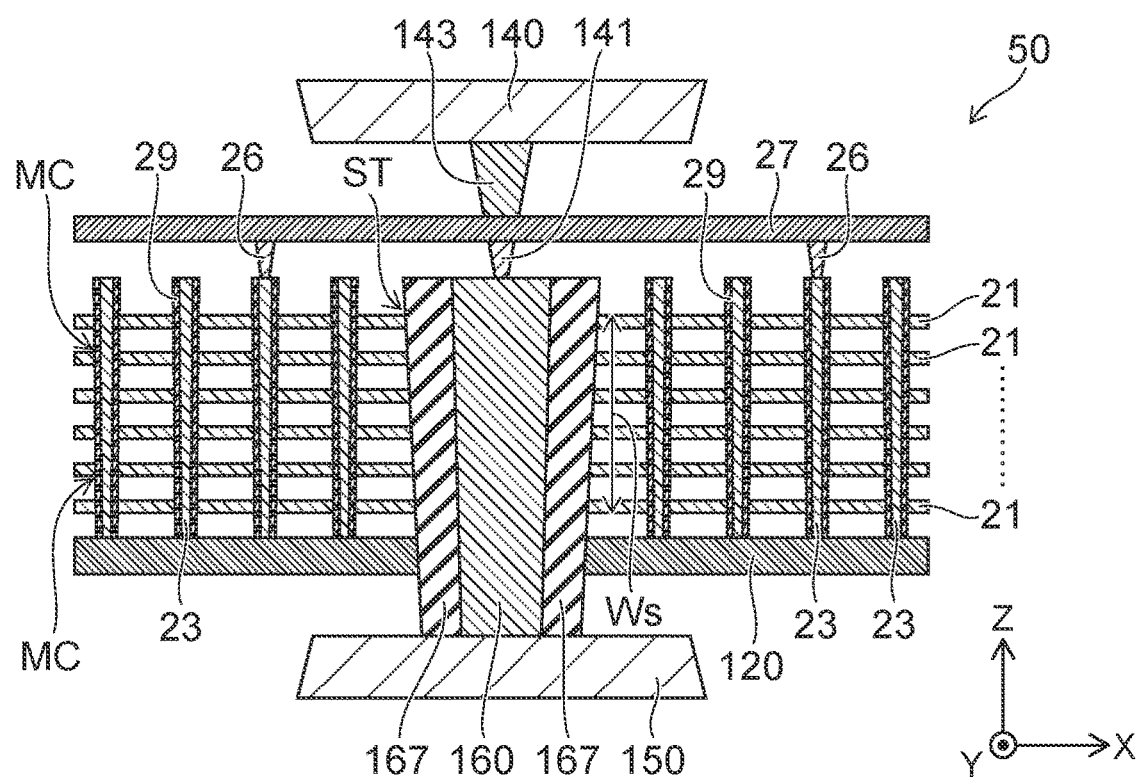

FIGS. 12A and 12B are schematic views showing the memory cell array 50 of the memory device according to the second embodiment. FIG. 12A is a schematic plan view showing a top surface of the memory cell array 50. FIG. 12B is a schematic view showing a cross-section taken along the line 12B-12B shown in FIG. 12A.

As shown in FIG. 12A, a plurality of connection pads 140 are provided above the interconnections 27. The connection pads 140 are electrically connected to the respective interconnections 27. Specifically, the connection pads 140 are disposed above the interconnections 27 arranged in the X-direction so that the number of connection pads 140 is same as the number of the interconnections 27.

As shown in FIG. 12B, a contact plug 160 extends in the Z-direction in a slit ST. The contact plug 160 extends with a length longer than a stacking width Ws of the electrode layers 21. Further, the contact plug 160 is electrically isolated by an insulating film 167 from the electrode layers 21 and a source line 120.

The contact plug 160 is connected to the connection pad 150 at the bottom end thereof. Further, the contact plug 160 is electrically connected to one of the interconnections 27 at the top end thereof via a contact plug 141. Further, the one of interconnections 27 is electrically connected to a connection pad 140 via a contact plug 143. As a result, the contact plug 160 is electrically connected to the one of the interconnections 27 and one of the connection pads 140.

In the embodiment, a plurality of memory cell arrays 50 is stacked, for example, on the drive circuit 10 (see FIG. 1). The memory cell arrays 50 having a structure shown in FIG. 12B are stacked upside down. Then, a connection pad 150 of one of the memory cell arrays 50 is connected to a connection pad 140 of another of the memory cell arrays 50 stacked thereon. Thereby, semiconductor pillars 23 of the memory cell arrays 50 stacked vertically on one another are electrically connected to each other.

Moreover, also in the embodiment, source lines 120 of the memory cell arrays 50 stacked vertically on one another are electrically connected to each other via contact plugs not shown (e.g., the contact plugs 80 in FIG. 4).

Figure 13A:
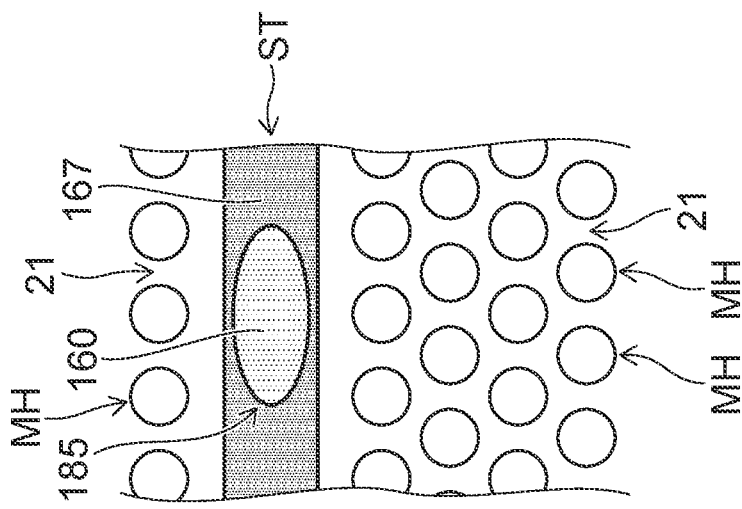
FIGS. 13A to 13C are schematic views showing a manufacturing process of the memory cell array of the memory device according to the second embodiment.
Figure 13B:
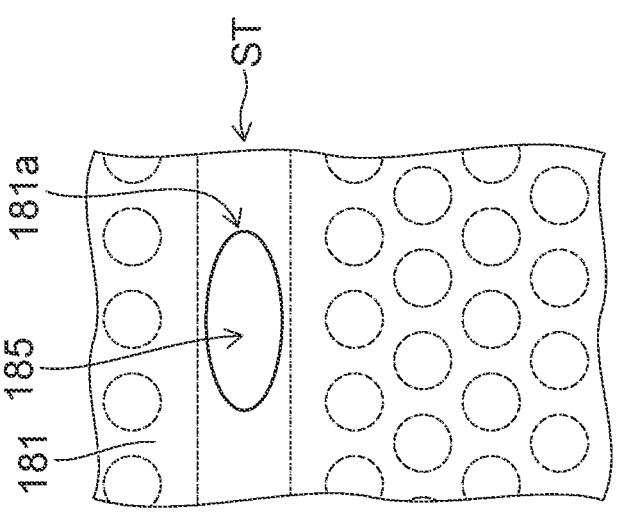
Figure 13C:
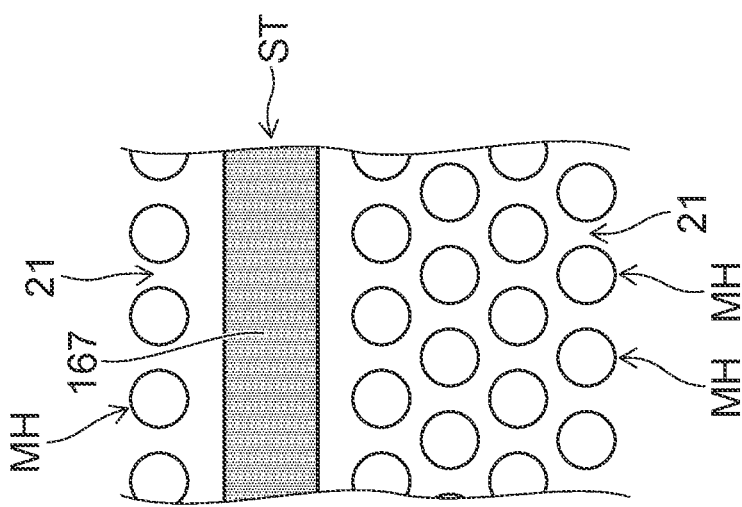

FIGS. 13A to 13C are schematic views showing a manufacturing process of the memory cell array 50 according to the second embodiment. FIGS. 13A to 13C are schematic plan views showing a process of forming the contact plug 160.

As shown in FIG. 13A, a slit ST between the electrode layers 21 is filled with an insulating film 167. The insulating film 167 is, for example, a silicon oxide film formed using the CVD, Then, the semiconductor pillars 23 and the memory films 29 not shown in the drawings formed in the memory holes MH, respectively.

As shown in FIG. 13B, an etching mask 181, for example, a resist film, is formed to cover the memory holes MH and the insulating film 167. The etching mask 181 includes an opening 181a located on the slit ST. Subsequently, the insulating film 167 are selectively removed using the etching mask 181 to form a contact hole 185 extending in the Z-direction in the slit ST, and communicated with a part that is to be a connection pad 150 (see FIG. 6A and FIG. 12B).

As shown in FIG. 13C, a contact plug 160 is formed in the contact hole 185. The contact plug 160 is a metal layer embedded in the contact hole 185, and includes, for example, tungsten.

FIGS. 14A to 14C are schematic views showing a manufacturing process of the memory cell array 50 according to a variation of the second embodiment. FIGS. 14A to 14C are schematic plan views showing a process of forming contact plugs 170. Each contact plug 170 extends in a slit ST with a length longer than the stacking width Ws of the electrode layers 21.

As shown in FIG. 14A, the slit ST formed between the electrode layers 21 includes first parts WP and second parts NP. A width W1 in the Y-direction of the first parts WP is wider than a width W2 in the Y-direction of the second parts NP.

As shown in FIG. 14B, the insulating film 167 is formed in the slit ST. The insulating film 167 is, for example, a silicon oxide film formed using CVD. The insulating film 167 is formed, for example, to have a thickness of occluding the second parts NP and leaving a contact hole 187 in each first part WP. In other words, the first parts WP and the second parts NP are formed so that a difference between the width W1 of the first parts WP and the width W2 of the second parts NP is larger than a width in the Y-direction of a contact plug 170.

As shown in FIG. 14C, the contact plug 170 is formed in each contact hole 187, The contact plug 170 is a metal layer embedded in a contact hole 187, and includes, for example, tungsten.

FIGS. 15A to 15C are schematic cross-sectional views showing a manufacturing process of the memory cell array 50 according to another variation of the second embodiment. FIGS. 15A through 15C are schematic plan views showing a process of forming contact plugs 180. The contact plugs 180 extend in the slit ST with a length longer than the stacking width WS of the electrode layers 21.

As shown in FIG. 15A, the slit ST is formed between the electrode layers 21 with a shape, for example, including circular openings and a plurality of contact holes CH linked in the X-direction. The contact holes CH are each formed, for example, so as to extend in the Z-direction and to be communicated with a portion that is to be the connection pad 150 (see FIG. 6A and FIG. 12B). The contact holes CH are formed so that a diameter RS thereof, for example, is larger than a diameter of each contact plug 180.

As shown in FIG. 15B, the insulating film 167 is formed in the slit ST. The insulating film 167 is, for example, a silicon oxide film formed using CVD. The insulating film 167 is formed, for example, to have a thickness capable of leaving contact spaces 189 in the contact holes CH respectively.

As shown in FIG. 15C, the contact plugs 180 are formed in the contact spaces 189. The contact plugs 180 are metal layers embedded in the contact spaces 189, and include, for example, tungsten.

Third Embodiment

Figure 16A:
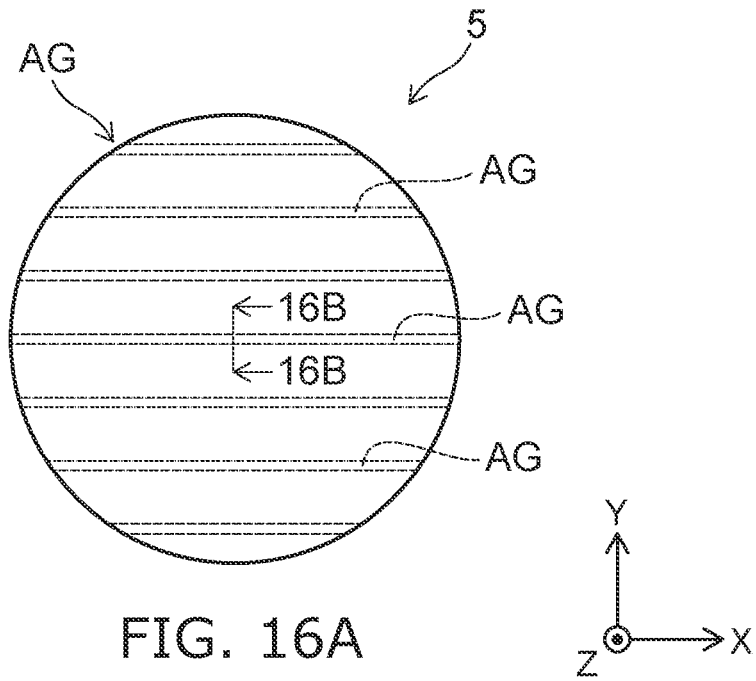
FIGS. 16A and 16B are schematic cross-sectional views showing a manufacturing process of the memory device according to a third embodiment.
Figure 16B:
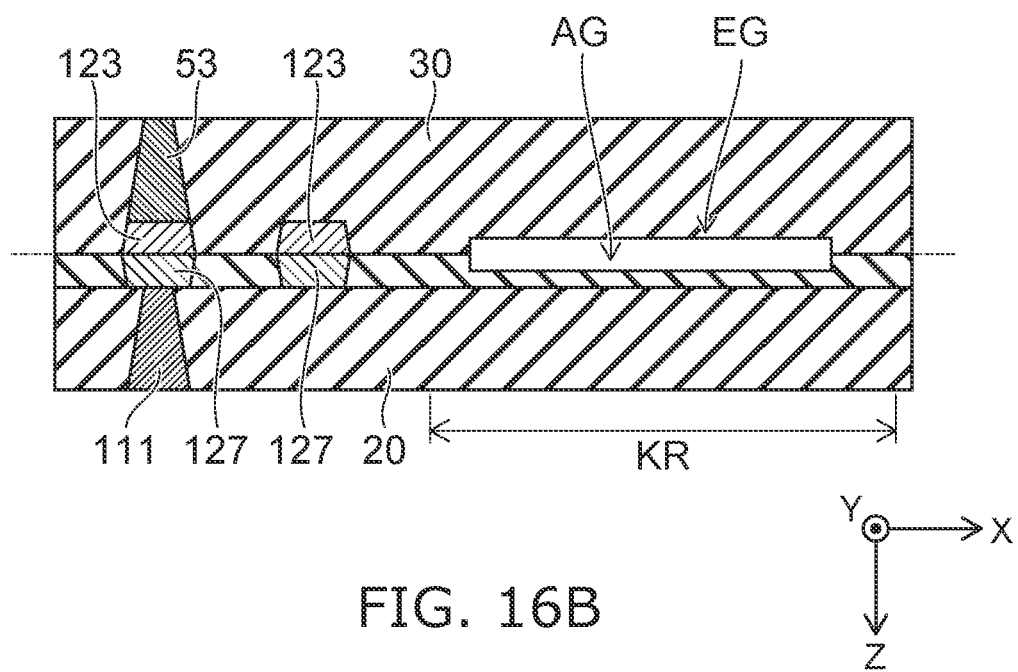

FIGS. 16A and 16B are schematic cross-sectional views showing a manufacturing process of the memory device 1 according to a third embodiment. FIG. 16A is, for example, a schematic plan view showing a wafer 5 including the memory cell array 20 and the memory cell array 30 bonded to each other (see FIG. 1). FIG. 16B is a schematic cross-sectional view taken along the line 16B-16B shown in FIG. 16A.

As shown in FIG. 16A, the wafer 5 includes, for example, air gaps AG each extending in the X-direction. An air gap AG extends to an outer edge of the wafer 5, and is in communication with outside at both ends thereof.

As shown in FIG. 16B, the air gap AG is provided at the boundary between the memory cell array 20 and the memory cell array 30. Specifically, the air gap AG is formed in the boundary where the memory cell array 20 and the memory cell array 30 are bonded to each other, and acts as an exhaust channel of air remaining therebetween, Thus, it is possible to prevent a so-called void from being formed at the boundary between the memory cell array 20 and the memory cell array 30, which may cause a bonding failure.

The air gap AG is formed by providing a groove EG to either one or both of the memory cell array 20 and the memory cell array 30, and then bonding the memory cell array 20 and the memory cell array 30 to each other.

The air gap AG is provided, for example, in a so-called dicing region KR between the chips that are cut out from the wafer 5. The dicing region KR is provided so as to surround a device region DR including the memory cells MC and the interconnections. Thus, it is possible to improve adhesiveness between the bonding surfaces of the memory cell arrays in the device region DR.

Figure 17A:
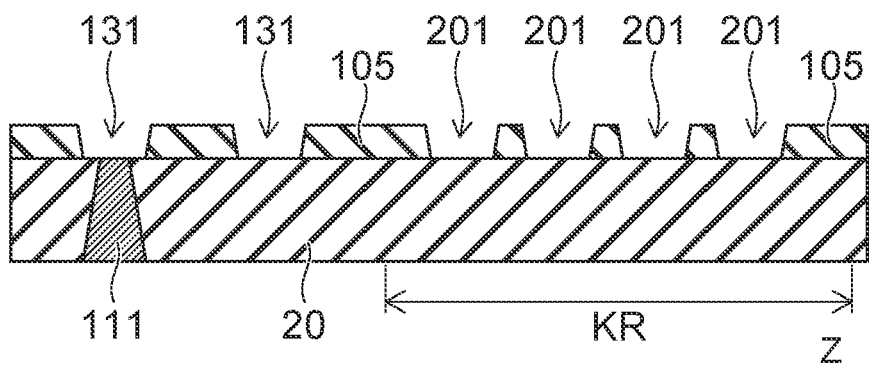
FIGS. 17A to 17C are schematic cross-sectional views showing a manufacturing process of the memory device according to a variation of the third embodiment.
Figure 17B:
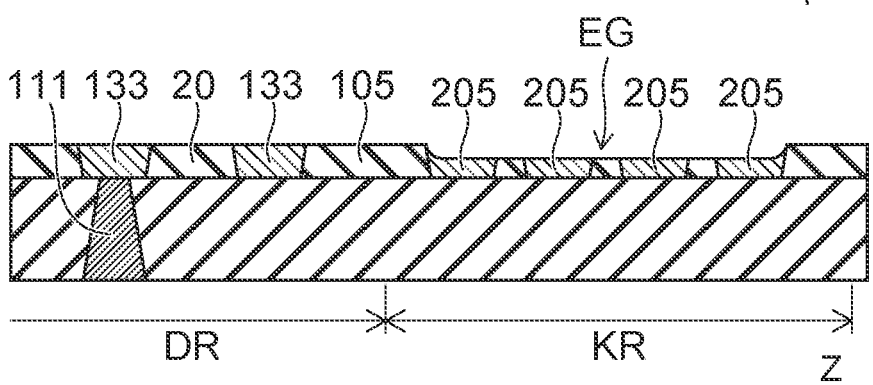
Figure 17C:
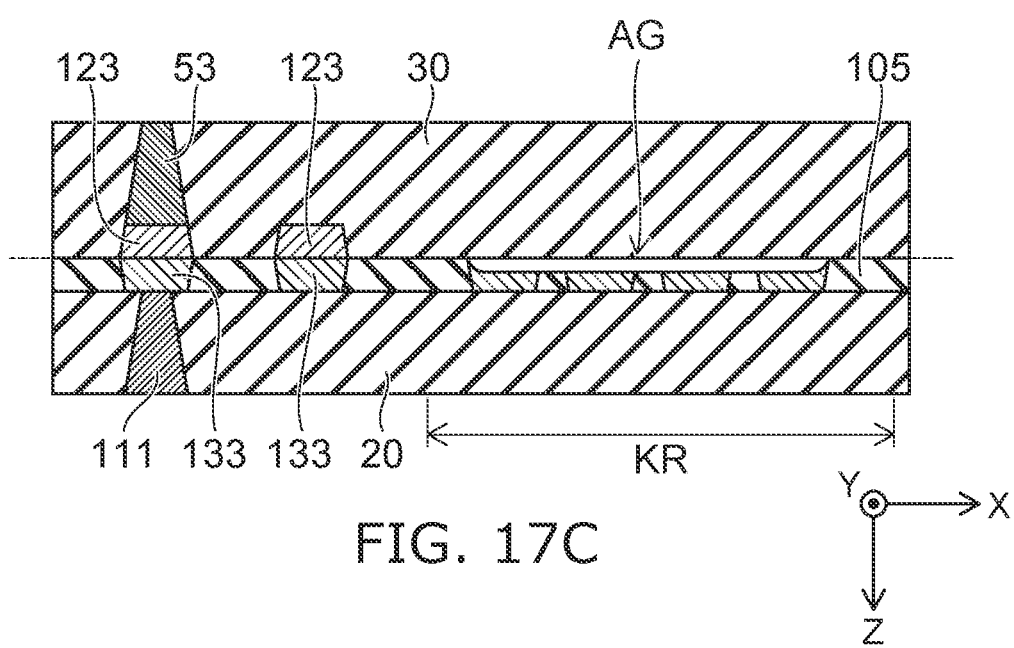

FIGS. 17A to 17C are schematic cross-sectional views showing a manufacturing process of the memory device 1 according to a variation of the third embodiment. FIGS. 17A to 17C are schematic diagrams each showing a part corresponding to a cross-section taken along the line 16B-16B shown in FIG. 16A.

As shown in FIG. 17A, recessed parts 131 and 201 are formed on the top surface thereof after bonding the memory cell array 20 to the drive circuit 10. The recessed parts 131 and 201 are formed, for example, by removing the substrate 110 from the memory cell array 20 (see FIG. 8A).

As shown in FIG. 17B, the recessed parts 131 and 201 are filled with metal to form the connection pads 133 and metal patterns 205. The connection pads 133 and the metal pattern 205 are, for example, made of copper or a copper alloy.

In this process, for example, a metal layer thicker than the depth of the recessed parts 131 and 201 is formed on the top surface of the memory array 20. Subsequently, the metal layer is removed using, for example, CMP while leaving the parts embedded in the recessed parts 131 and 201.

When a ratio of an area of the metal pattern 205 to a surface area of the dicing region KR is large, a groove EG is formed in the dicing region KR due to so-called dishing. Therefore, the ratio of the area of the metal pattern 205 to the surface area of the dicing region KR is set larger than, for example, a ratio of an area of the connection pad 133 to an area of the device region DR of the memory cell array 20 so that the groove EG is formed in the dicing region KR.

As shown in FIG. 7C, the memory cell array 20 and the memory cell array 30 are bonded to each other. In the device region DR, for example, the connection pad 133 of the memory cell array 20 and the connection pad 123 of the memory cell array 30 are connected to each other. In contrast, an air gap AG is formed at the position of the groove EG in the dicing region KR. Thus, it is possible to prevent the void from being formed between the memory cell arrays, and to improve the adhesiveness between the memory cell arrays.

Further, it is also possible to reduce the wafer warp by providing a plurality of grooves EG to make the grooves extend linearly in one direction on the wafer. Moreover, as described above, it is possible to form the grooves EG by using dishing in the CMP without using, for example, photolithography and selective etching. Thus, it is possible to simplify the manufacturing process of memory cell arrays.

Figure 18A:
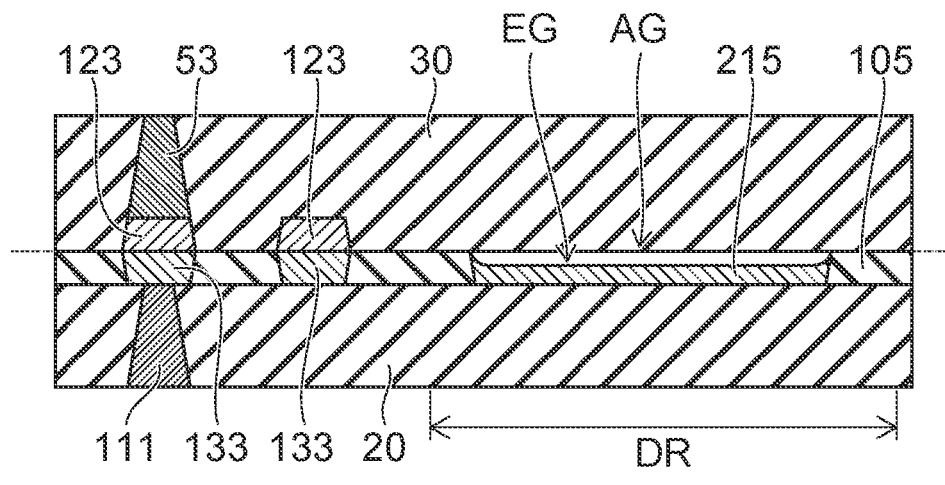
FIGS. 18A and 18B are schematic cross-sectional views showing a manufacturing process of the memory device according to another variation of the third embodiment.
Figure 18B:
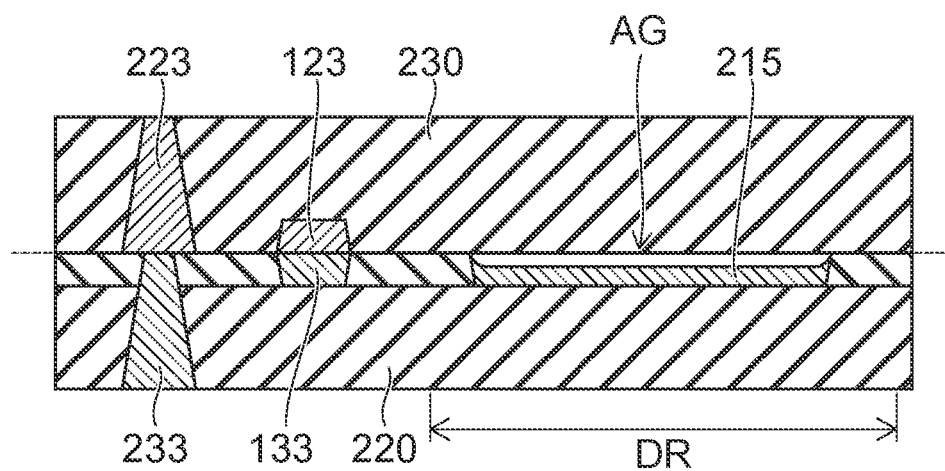

FIGS. 18A and 18B are schematic cross-sectional views showing a manufacturing process of the memory device 1 according to another variation of the third embodiment. FIGS. 18A and 18B are schematic views each showing a part corresponding to a cross-section along the line 16B-16B shown in FIG. 16A.

As shown in FIG. 18A, it is possible to form a metal pattern 215 so as to be exposed on the entire inner surface of the groove EG in the air gap AG. In other words, the metal pattern 215 can also be formed so that a width in the X-direction is roughly same as a width in the X-direction of the groove EG. Thus, when performing CMP, the dishing becomes large, making it possible to form the groove EG with a larger depth. As a result, a width in the Z-direction of the air gap AG increases. The metal pattern is, for example, made of copper or copper alloy.

In the example shown in FIG. 18B, a memory cell array 220 and a memory cell array 230 are bonded to each other. The memory cell arrays 220 and 230 each include contact plugs 223 and 233, and the end surfaces thereof act as the connection pads. Therefore, as shown in FIGS. 18A and 18B, when bonding the memory cell array 220 and the memory cell array 230 to each other, the contact plug 233 of the memory cell array 220 can directly be connected to the contact plug 223 of the memory cell array 230. Further, the metal pattern 215 is exposed on the inner surface of the air gap AG formed at the boundary between the memory cell arrays.

In the example described above, a part of the air gaps AG remains on an outer edge of the chip when the memory device 1 is cut out from the wafer 5 as a chip. In the memory device 1 according to the third embodiment, the area ratio of the metal pattern 205 to the insulating film 105 exposed in the part of the air gap AG is larger than the area ratio of the connection pad 133 to the insulating film 105 at the boundary between the memory cell arrays.

Fourth Embodiment

Figure 19A:
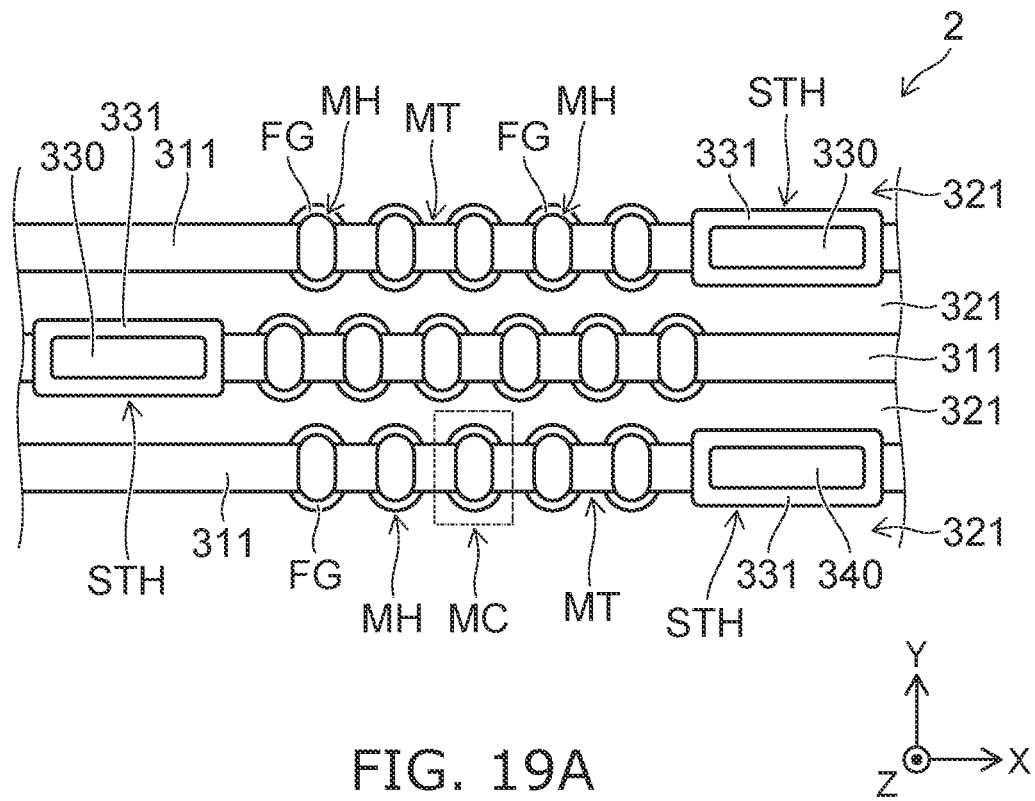
FIGS. 19A and 19B are schematic plan views showing a memory device according to a fourth embodiment.
Figure 19B:
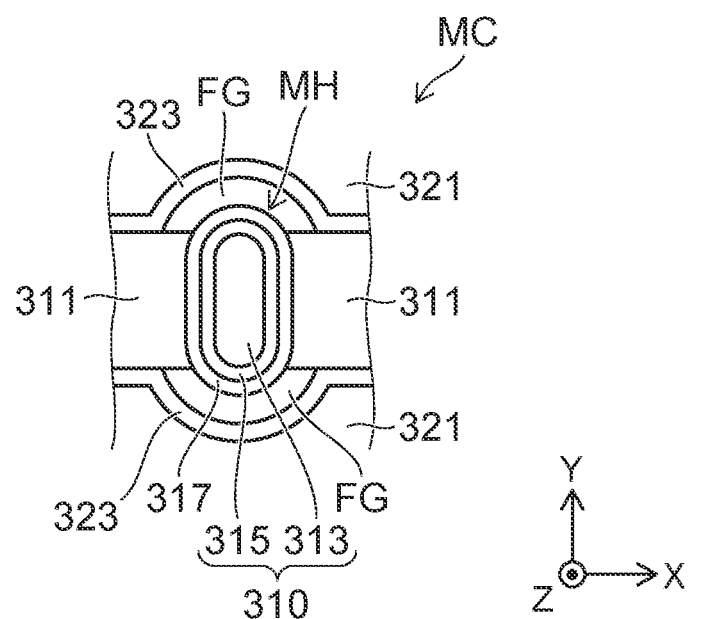

FIGS. 19A and 19B are schematic plan views showing a memory device 2 according to a fourth embodiment. FIG. 19A is a plan view showing an arrangement of the memory cells MC of the memory device 2. FIG. 19B is a plan view showing the memory cell MC of the memory device 2.

As shown in FIG. 19A, the memory device 2 includes a plurality of electrode layers 321 extending in the X-direction. The electrode layers 321 are arranged in the Y-direction. Further, the electrode layers 321 are stacked in the Z-direction via interlayer insulating films not shown. An insulator 311A is embedded in a space MT between electrode layers 321 adjacent to each other in the Y-direction. The insulator 311 is, for example, silicon oxide.

The memory holes MH of the memory device 2 are provided so as to extending in the Z-direction through the insulator 311. Further, the memory holes MH are formed so that the insulator 311 is divided into a plurality of parts. The memory device 2 further includes contact holes STH extending in the Z-direction through the insulator 311. Contact plugs 330 and 340 are disposed in the respective contact holes STH. Further, insulating films 331 are provided respectively in the contact holes STH for electrically insulating the contact plugs 330 and 340 from the electrode layers 321.

As shown in FIG. 19B, a semiconductor pillar 310 extending in the Z-direction is provided in a memory hole MH. The semiconductor pillar 310 includes an insulating core 313 and a semiconductor layer 315. The insulating core 313 is, for example, silicon oxide extending in the Z-direction. The semiconductor layer 315 covers a side surface of the insulating core 313, and extends in the Z-direction. The semiconductor layer 315 is, for example, a polycrystalline silicon layer.

An insulating film 317 is further provided in the memory hole MH. The insulating film 317 is provided between the inner wall of the memory hole MH and the semiconductor pillar 310. The insulating film 317 is, for example, a silicon oxide film.

As shown in FIG. 19B, a memory cell of the memory device 2 includes, for example, a floating gate FG. The floating gate FG is provided so as to extend into an electrode layer 321 from the insulating film 317, which covers the inner wall of the memory hole MH. An insulating film 323 is provided between the floating gate FG and the electrode layer 321.

The floating gate FG is provided so as to extend into each of the electrode layers 321 stacked in the Z-direction, and is disposed separately from each other along the memory hole MH extending in the Z-direction. One memory hole MH is provided between two electrode layers 321 adjacent to each other in the Y-direction, and two floating gates FG are provided toward the two electrode layers 321 respectively. The two floating gates FG operate independently from each other. That is, it is possible in the memory device 2 to dispose the two memory cells MC in each memory hole MH at one level in the Z-direction, which is provided between the two adjacent electrode layers 321.

In each memory cell MC, a portion of the insulating film 317 positioned between the semiconductor pillar 310 and the floating gate FG acts as a tunnel insulating film. Further, a portion of the insulating film 323 positioned between the electrode layer 321 and the floating gate FG acts as a blocking insulator film.

Figure 20:
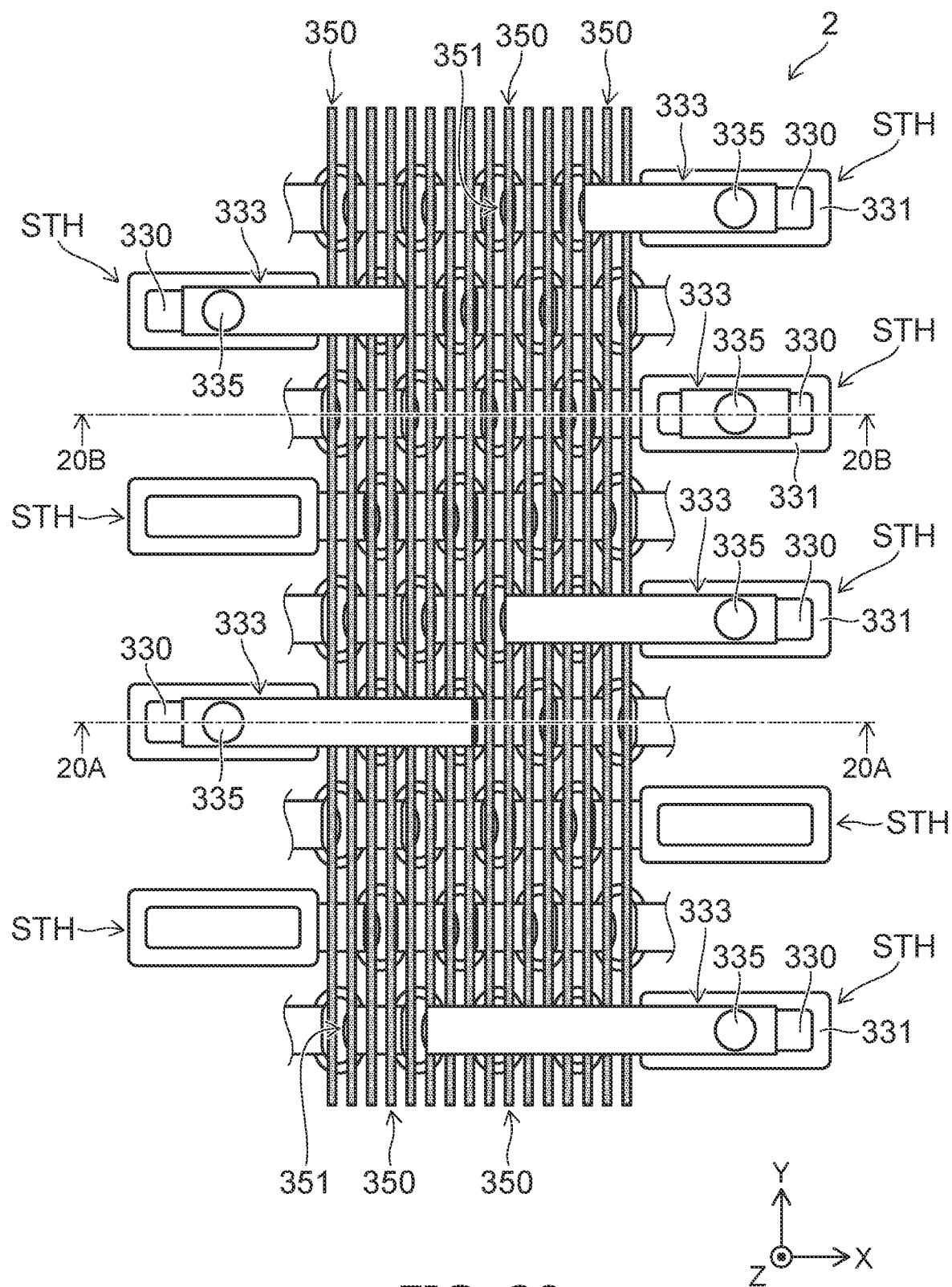
FIG. 20 is another schematic plan view showing the memory device according to a fourth embodiment.

FIG. 20 is another schematic plan view showing the memory device 2. As shown in FIG. 20, a plurality of bit lines 350 are provided in the Y-direction crossing the electrode layers 321. The bit lines 350 are disposed above the memory holes MH and are electrically connected to the semiconductor pillars 310 via contact plugs 351, respectively.

As shown in FIG. 20, contact holes STH are arranged in the Y-direction. No bit line 350 is disposed above the contact holes STH. The bit lines 350 are electrically connected via interconnections 333 to the contact plugs 330 respectively, which are provided in the contact holes STH. Each bit line 350 is electrically connected to one of the contact plugs 330.

Figure 21:
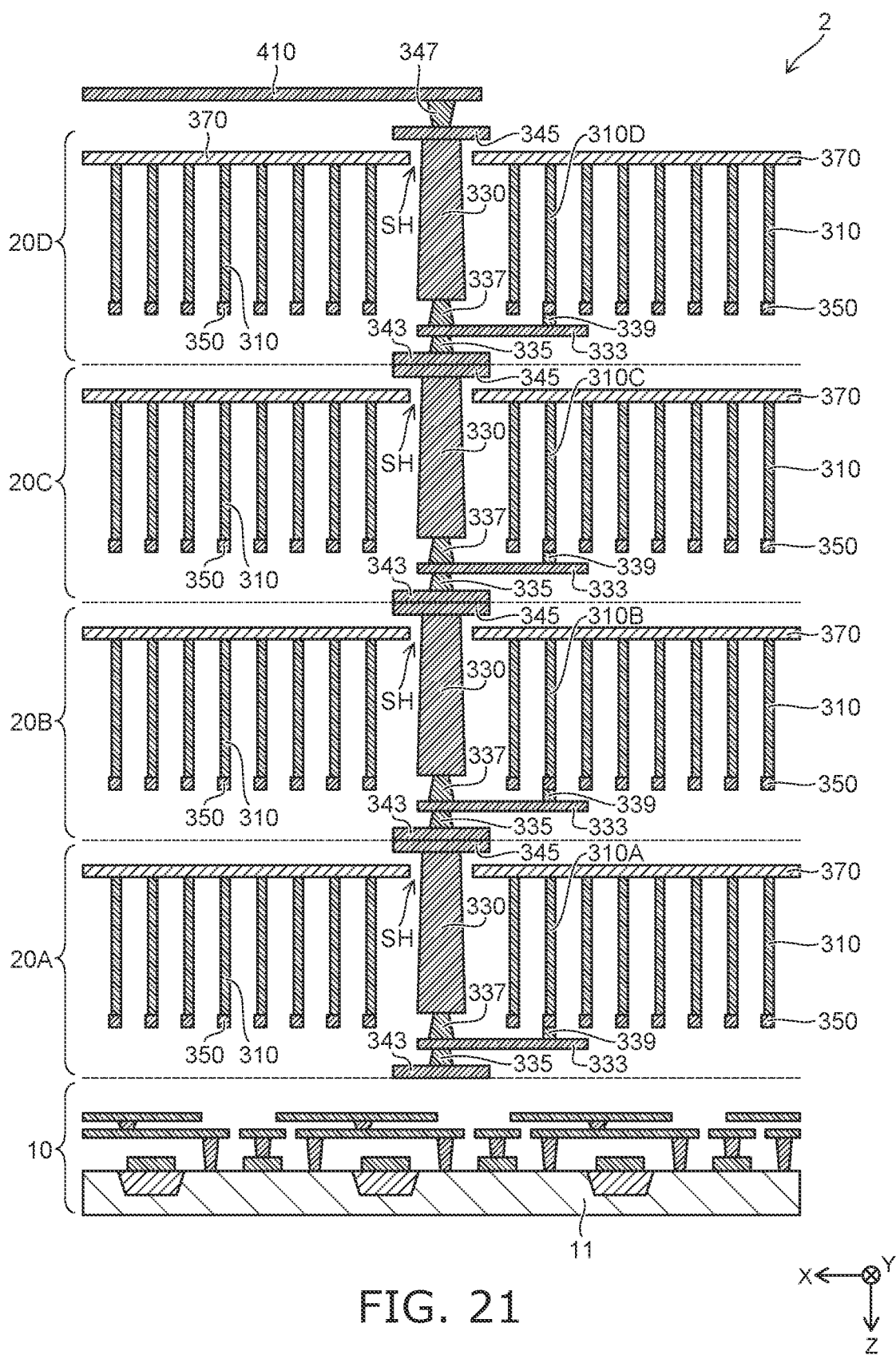
FIG. 21 is a schematic cross-sectional view showing the memory device according to the fourth embodiment.

FIG. 21 is a schematic cross-sectional view showing the memory device 2. FIG. 21 is a cross-sectional view taken along the line 20A-20A shown in FIG. 20, and includes the contact plugs 330. It should be noted that insulating films and insulators electrically insulating each element from one another are omitted in FIG. 21, for convenience.

As shown in FIG. 21, the memory device 2 includes a plurality of memory cell arrays 20, for example, which include memory cell arrays 20A, 203, 20C and 20D stacked on the drive circuit 10. The number of memory cell arrays stacked is arbitrary, and is not limited to this example.

The memory cell arrays 20 each include a plurality of semiconductor pillars 310, a contact plug 330, bit lines 350, and a source line 370. One end of each semiconductor pillar 310 is electrically connected to a bit line 350, and the other end thereof is electrically connected to the source line 370. The contact plugs 351 are omitted in FIG. 21, for convenience.

The source line 370 is, for example, a conductive body with a plate-like shape extending in the X-direction and the V-direction. The electrode layers 321 are stacked on the source line 370 (see 19A). Further, the contact plug 330 is provided so as to extend in the Z-direction through a through hole SH provided to the source line 370. The contact plug 330 is electrically isolated by an insulating film 331 from the source line 370.

In each memory cell array 20, the contact plug 330 is electrically connected to one of the bit lines 350 via an interconnection 333. As shown in FIG. 21, the interconnection 333 is connected to the bit line 350 via a contact plug 339, and is connected to the contact plug 330 via a contact plug 337.

Further, contact plugs 330 in the respective memory cell arrays 20 are connected in series to each other in the Z-direction. Contact plugs 330 in the memory cell arrays 20B and 20C are each connected to contact plugs 330 positioned above and below via bonding pads 343 and 345. As shown in FIG. 21, the bonding pads 343 are each electrically connected to the interconnection 333 via a contact plug 335. The bonding pad 345 is connected to the end of each contact plug 330.

The arrangement of the bonding pads 343 and 345 is not limited to this example, and the bonding pads 343 and 345 can also be provided, for example, between the bit lines 350 and the source line 370 as shown in FIG. 1 and FIG. 3.

Figure 22:
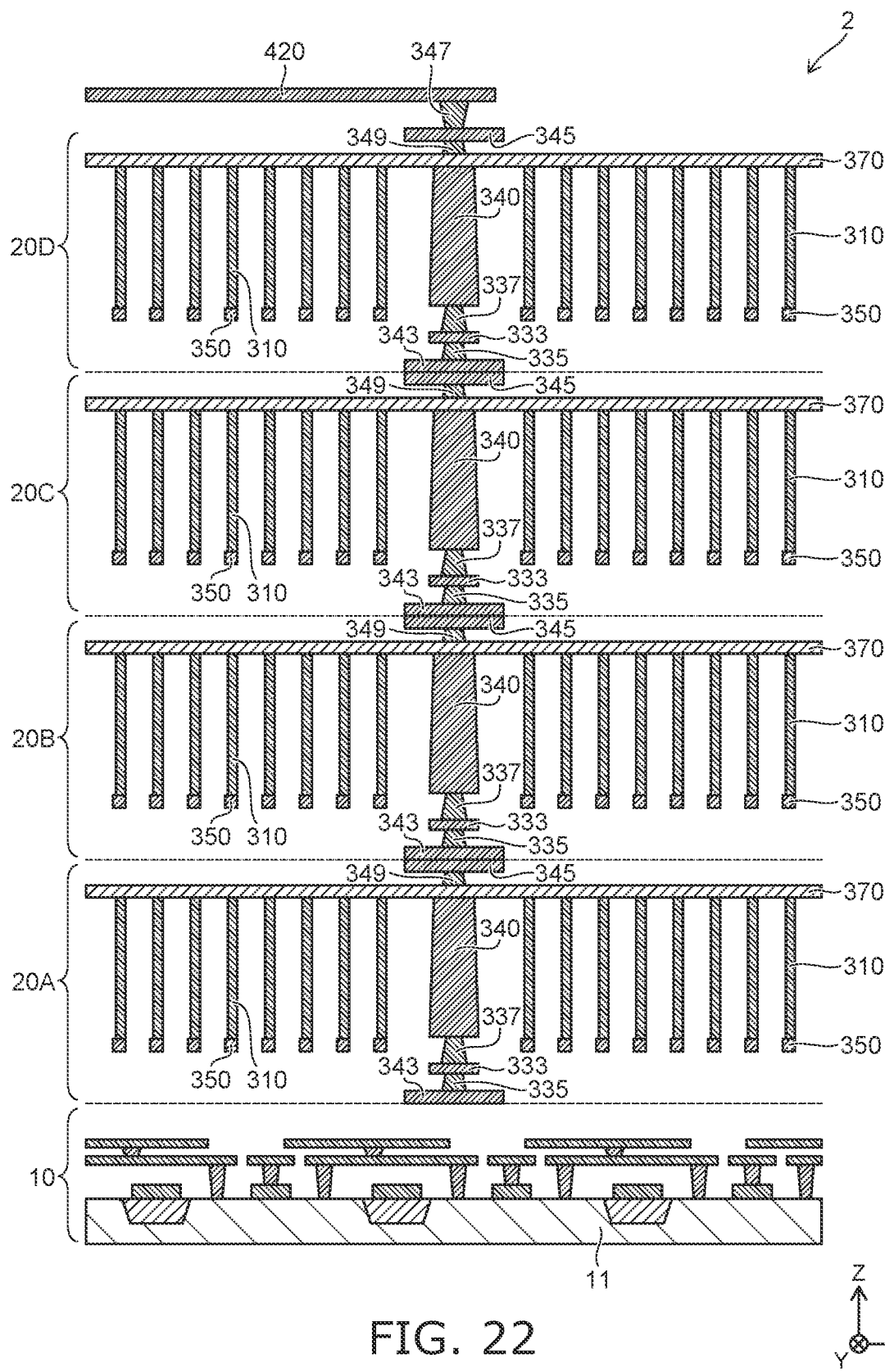
FIG. 22 is another schematic cross-sectional view showing the memory device according to the fourth embodiment.

A contact plug 330 in the memory cell array 20D is electrically connected to an interconnection 410 via a bonding pad 345 and a contact plug 347. The interconnection 410 is electrically connected, for example, via the contact plug 53 to the sense amplifier SA of the drive circuit 10, which is provided in a periphery of the memory cell arrays 20 (see FIG. 1). As a result, the bit lines 350 of the respective memory cell arrays 20 are connected in parallel to the sense amplifier SA via contact plugs 330. Thereby, it becomes possible to stack the memory cell arrays 20 without reducing a cell current flowing through each semiconductor pillar 310, and thus, it is possible to enlarge the storage capacity of the memory device 2, FIG. 22 is another schematic cross-sectional view showing the memory device 2. FIG. 22 is a cross-sectional view taken along the line 20B-20B shown in FIG. 20, and includes the contact plugs 340. Also in FIG. 22, insulating films and insulators for electrically insulating elements from each other are omitted for convenience.

As shown in FIG. 22, a contact plug 340 is connected to a source line 370 in each memory cell array 20. Further, the contact plug 340 is electrically connected to a bonding pad 343 via an interconnection 333, a contact plug 335, and a contact plug 337. Meanwhile, the source line 370 is electrically connected to a bonding pad 345 via a contact plug 349.

For example, each source line 370 of the memory cell arrays 20B and 20C is electrically connected via the bonding pads 343 and 345 to source lines 370 of the memory cell arrays 20 positioned above and below.

A contact plug 340 of the memory cell array 20D is electrically connected to an interconnection 420 via a bonding pad 345 and a contact plug 349. The interconnection 420 is electrically connected, for example, via the contact plug 53 to a drive transistor in the drive circuit 10 (see FIG. 1), which is provided in the periphery of the memory cell arrays 20. As a result, the source lines 370 of the respective memory cell arrays 20 are connected in series to each other via contact plugs 340, and are electrically connected to the drive circuit 10.

Figure 23A:
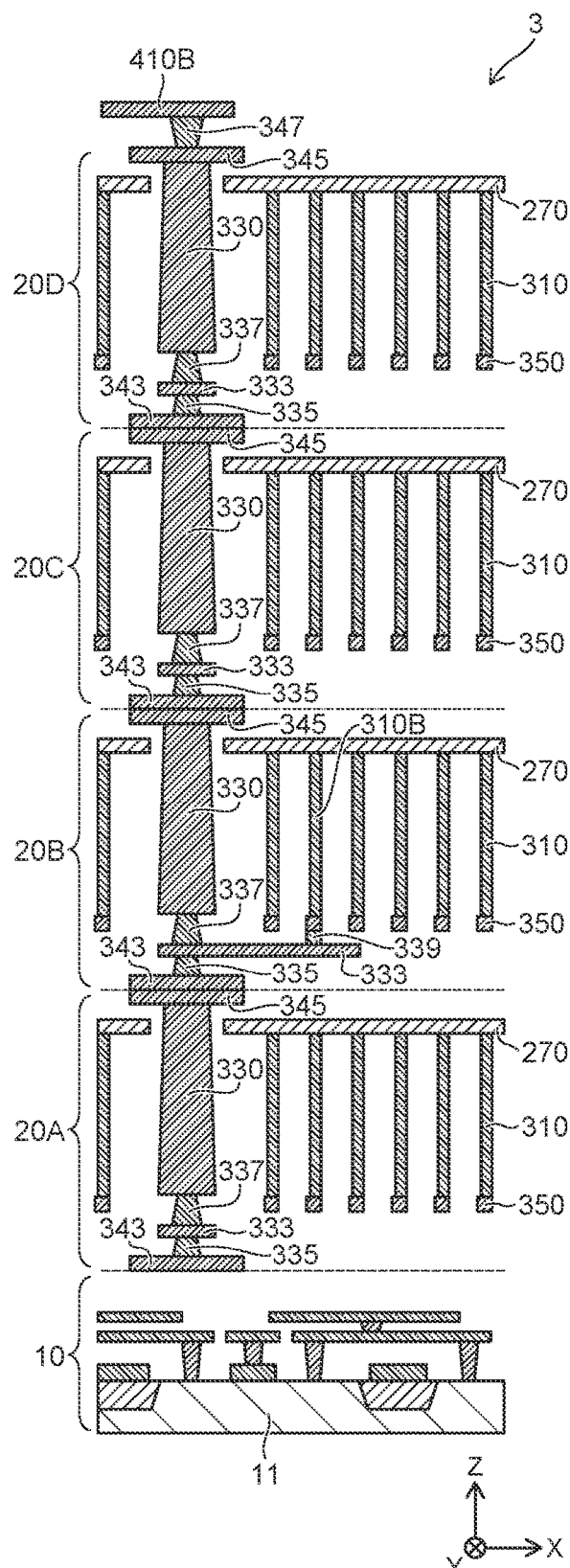
FIGS. 23A and 23B are schematic cross-sectional views showing a memory device according to a variation of the fourth embodiment.
Figure 23B:
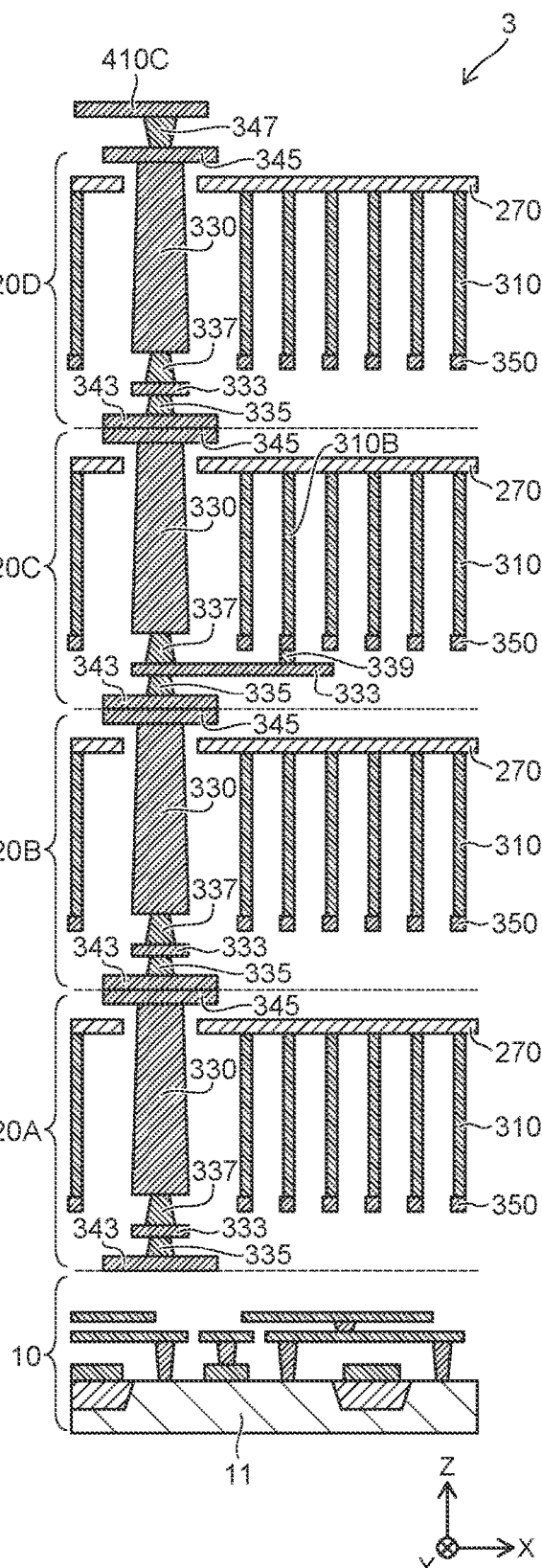

FIGS. 23A and 23B are schematic cross-sectional views showing a memory device 3 according to a variation of the fourth embodiment. FIGS. 23A and 23B are schematic views showing cross-sections including the contact plugs 330 respectively, and FIG. 23B is a schematic diagram showing a cross-section different from a cross-section in FIG. 23A.

In an example shown in FIG. 23A, a contact plug 330 in the memory cell array 20B is electrically connected to one bit line 350 via an interconnection 333. In contrast, no bit line 350 is electrically connected to contact plugs 330 in the memory cell arrays 20A, 20C and 20D. Thus, the one bit line 350 is electrically connected to an interconnection 410B via contact plugs 330 connected in series to each other, and is further connected to a sense amplifier SA.

In an example shown in FIG. 23B, a contact plug 330 of the memory cell array 20C is electrically connected to one bit line 350 via an interconnection 333. In contrast, no bit line 350 is electrically connected to contact plugs 330 in the memory cell arrays 20A, 20B and 20D. Thus, the one bit line 350 is electrically connected to an interconnection 410C via contact plugs 330 connected in series to each other.

As described above, in the memory device 3, one of bit lines 350 in the memory cell arrays 20 stacked in multiple stage is connected to one sense amplifier SA via contact plugs 330 connected in series to each other. Thereby, it becomes possible to stack the memory cell arrays 20 without reducing a cell current flowing through each semiconductor pillar 310, and at the same time, it is possible to increase a rate of reading data out from each memory cell MC.

As described above, the examples in the embodiment show the cases where the respective bit lines 350 of the memory cell arrays 20 stacked into multiple stages are connected in parallel to the sense amplifier SA via the contact plugs 330 connected in series to each other, and one bit line 350 in the memory cell arrays 20 stacked into the multiple stages is connected to one sense amplifier SA, but the embodiment are not limited thereto. For example, it is possible in the memory cell arrays 20 stacked into the multiple stages to connect an arbitrary number of bit lines 350 in parallel to a sense amplifier SA via the contact plugs 330 connected in series, depending on the number of the bit lines and the number of the contact holes STH in each memory cell array 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a first memory cell array including a first stacked body, the first stacked body including a plurality of first electrode layers each extending in a first direction; and
   a peripheral circuit facing the first memory cell array and driving the first memory cell array, the peripheral circuit and the first memory cell array being arranged in a second direction, the second direction crossing the first direction, the plurality of first electrode layers being stacked in the second direction, wherein
   the plurality of first electrode layers each has a length along the first direction such that a first-first electrode layer of the plurality of first electric layers has a length shorter than a length of a second-first electrode layer of the plurality of first electric layers, and
   the first-first electrode layer is positioned between the peripheral circuit and the second-first electrode layer.

2. The device according to claim 1, further comprising:
   a first contact line connected to each of the plurality of first electrode layers; and
   a second contact line connected to the peripheral circuit, the second contact line being electrically connected to the first contact line.

3. The device according to claim 2, further comprising:
a first bonding electrode connected to the first contact line; and
a second bonding electrode connected to the second contact line, wherein
the second bonding electrode is connected to the first bonding electrode at a first bonding surface,
the first bonding electrode has a first diameter in a vicinity of the first bonding surface,
the second bonding electrode has a second diameter in a vicinity of the first bonding surface,
the first diameter is greater than a diameter of the first contact line, and
the second diameter is greater than a diameter of the second contact line.

4. The device according to claim 2, further comprising:
a second memory cell array provided on the first memory cell array, the first memory cell array being provided between the peripheral circuit and the second memory cell array, the second memory cell array including a second stacked body, the second stacked body including a plurality of second electrode layers each extending in the first direction, the plurality of second electrode layers being stacked in the second direction, wherein
the plurality of second electrode layers each has a length along the first direction such that a first-second electrode layer of the plurality of second electric layers has a length shorter than a length of a second-second electrode layer of the plurality of second electric layers, and
the first-second electrode layer is positioned between the first memory cell array and the second-second electrode layer.

5. The device according to claim 4, further comprising:
a third contact line connected to each of the plurality of second electrode layers, the third contact line being electrically connected to the first contact line.

6. The device according to claim 5, further comprising:
a third bonding electrode connected to the first contact line, the first contact line having first and second end arranged along the second direction, the first end being electrically connected to the peripheral circuit, the second end being connected to the third bonding electrode; and
a fourth bonding electrode connected to the third contact line, wherein
the third bonding electrode is connected to the fourth bonding electrode at a second bonding surface,
the third bonding electrode has a third diameter in a vicinity of the second bonding surface,
the fourth bonding electrode has a fourth diameter in a vicinity of the second bonding surface,
the third diameter is greater than a diameter of the first contact line, and
the fourth diameter is greater than a diameter of the third contact line.

7. The device according to claim 1, further comprising:
a fourth contact line connected to the peripheral circuit, wherein
the peripheral circuit is configured to receive date via the fourth contact line.

8. The device according to claim 7, wherein
the peripheral circuit includes a first region and a second region, the first region of the peripheral circuit facing the first memory cell array, the second region of the peripheral circuit being provided without facing the first memory cell array, and
the fourth contact line is connected to the second region of the peripheral circuit.

* * * * *